(12) United States Patent
Covannon et al.

(10) Patent No.: US 7,375,701 B2
(45) Date of Patent: May 20, 2008

(54) SCANLESS VIRTUAL RETINAL DISPLAY SYSTEM

(75) Inventors: Edward Covannon, Ontario, NY (US); Joseph A. Manico, Rochester, NY (US); John P. Spoonhower, Webster, NY (US); David L. Patton, Webster, NY (US)

(73) Assignee: Carestream Health, Inc., Rochester, NY (US)

( * ) Notice: Subject to any disclaimer, the term of this patent is extended or adjusted under 35 U.S.C. 154(b) by 725 days.

(21) Appl. No.: 10/883,510

(22) Filed: Jul. 1, 2004

(65) Prior Publication Data

US 2006/0033879 A1 Feb. 16, 2006

(51) Int. Cl.
*G09G 5/00* (2006.01)

(52) U.S. Cl. ............... 345/8; 345/1.1; 345/6; 345/30; 345/87

(58) Field of Classification Search ......... 345/1, 345/6, 8, 30, 87, 102, 204
See application file for complete search history.

(56) References Cited

U.S. PATENT DOCUMENTS

| | | | |
|---|---|---|---|
| 4,477,160 A | 10/1984 | Trumbull | 352/40 |
| 4,955,025 A | 9/1990 | Mears et al. | 372/6 |
| 5,499,138 A | 3/1996 | Iba | 359/569 |
| 5,696,371 A | 12/1997 | Meyers | 250/208.1 |
| 5,883,606 A | 3/1999 | Smoot | 345/7 |
| 6,140,979 A | 10/2000 | Gerhard et al. | 345/7 |
| 6,141,048 A | 10/2000 | Meyers | 348/294 |
| 6,160,667 A | 12/2000 | Smoot | 359/630 |
| 6,172,459 B1 | 1/2001 | Hung et al. | 313/506 |
| 6,184,969 B1 | 2/2001 | Fergason | 349/196 |
| 6,194,119 B1 | 2/2001 | Wolk et al. | 430/200 |
| 6,229,503 B1 | 5/2001 | Mays, Jr. et al. | 345/7 |
| 6,386,706 B1 | 5/2002 | McClure et al. | 351/237 |
| 6,454,411 B1 | 9/2002 | Trumbull | 351/211 |
| 6,474,816 B2 | 11/2002 | Butler et al. | 351/221 |
| 6,600,460 B1 | 7/2003 | Mays, Jr. | 345/7 |
| 6,628,446 B1 | 9/2003 | Shahar et al. | 359/210 |
| 6,636,185 B1 * | 10/2003 | Spitzer et al. | 345/8 |
| 6,639,570 B2 | 10/2003 | Furness et al. | 345/8 |

(Continued)

FOREIGN PATENT DOCUMENTS

EP 1 198 957 B1 5/2003

(Continued)

OTHER PUBLICATIONS

U.S. Appl. No. 10/271,816, filed Oct. 16, 2002, Joseph A. Manico et al.

(Continued)

*Primary Examiner*—Richard Hjerpe
*Assistant Examiner*—Leonid Shapiro

(57) ABSTRACT

A scanless display system that projects an image directly onto a retina, comprising a plurality of organic laser cavity devices. The organic laser cavity devices are placed in close proximity to a user's eye, for variably changing individual image pixels; wherein projecting the image directly onto the retina occurs by variably addressing individual image pixel locations and variably changing duration of illumination on individual image pixels upon the retina. Also included are a receiver for receiving transmitted electrical signals that include content information; a decoder for decoding received electrical signals; and a modulator for driving the scanless display under predetermined parameters.

34 Claims, 24 Drawing Sheets

U.S. PATENT DOCUMENTS

| | | | |
|---|---|---|---|
| 6,658,037 B2 | 12/2003 | Kahen et al. | 372/70 |
| 7,133,022 B2* | 11/2006 | Grabert | 345/156 |
| 2001/0022566 A1 | 9/2001 | Okazaki | 345/84 |
| 2001/0028332 A1 | 10/2001 | Roest | 345/8 |
| 2002/0163483 A1* | 11/2002 | Crist | 345/7 |

FOREIGN PATENT DOCUMENTS

| | | |
|---|---|---|
| GB | 2 284 902 A | 6/1995 |
| GB | 2 297 422 A | 7/1996 |
| WO | WO 94/09472 | 4/1994 |
| WO | WO 95/20811 | 8/1995 |
| WO | WO 99/38046 | 7/1999 |

OTHER PUBLICATIONS

"The Attenuation of Perceived Image Smear During Saccades" by H.E. Bedell and J. Yang, Vision Research, 41, 2001, pp. 521-528.

Corzine et al. IEEE J. Quant. Electr. 25, 1513, 1989.

* cited by examiner

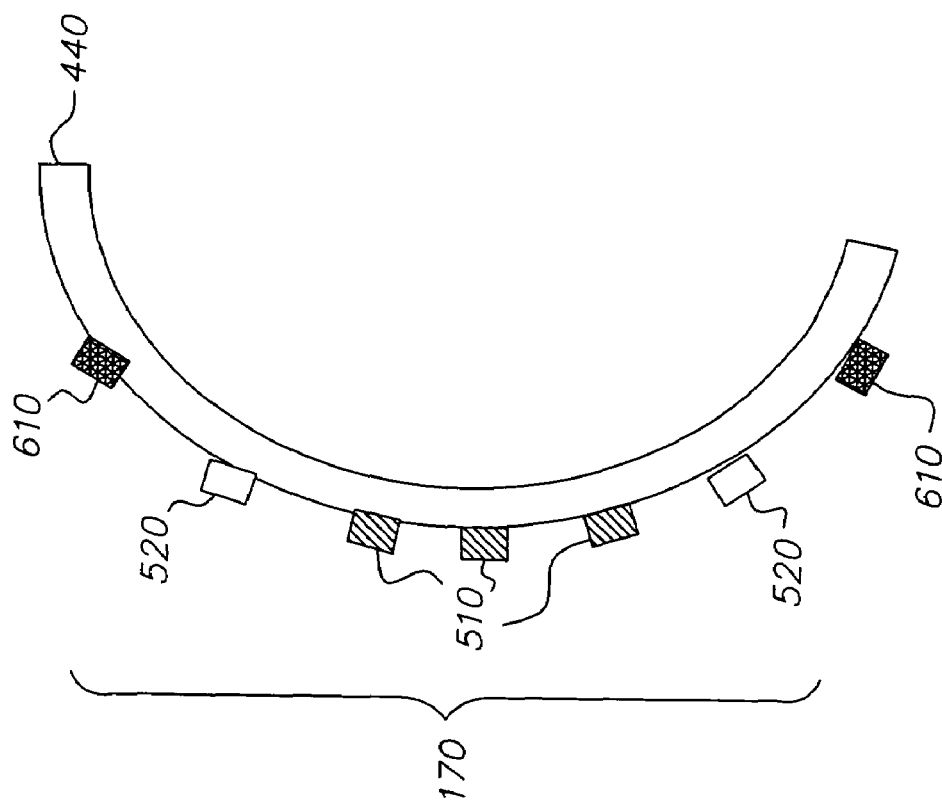
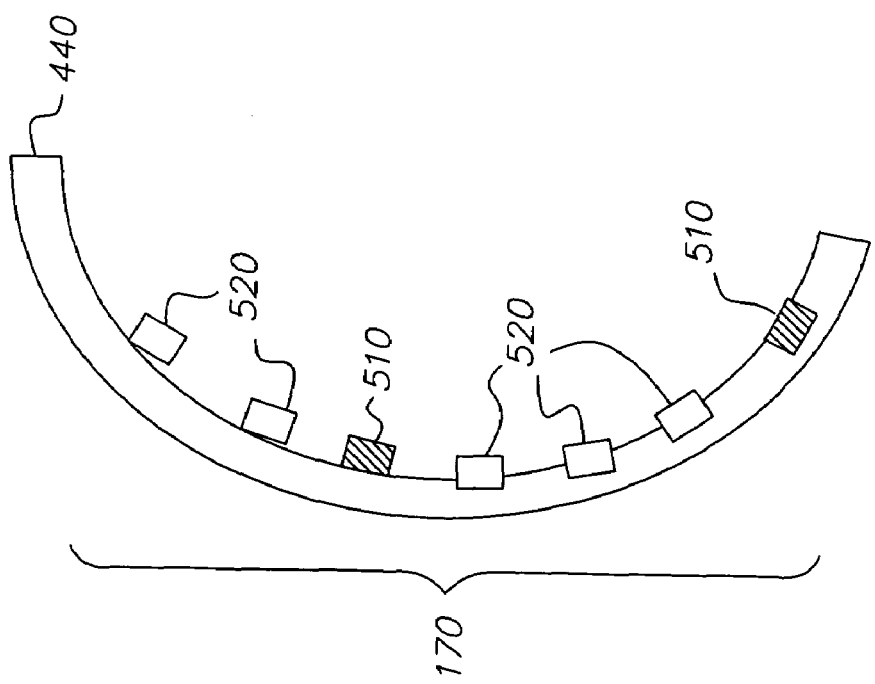

SCANLESS VIRTUAL RETINAL DISPLAY SYSTEM

FIELD OF THE INVENTION

The invention relates generally to the field of photonic emitter arrays. Specifically, the invention applies a novel refresh system to the area of display systems, and in particular to VRD (Virtual Retinal Display) systems. Additionally, the invention defines a display system that uses individually addressable lasers in an array, those lasers having features typical of VCSELs (Vertical Cavity Surface Lasers) as well as micro-lenses, sensors and other components appropriate to interactive graphics displays.

BACKGROUND OF THE INVENTION

There has been a constant effort to use technology to substitute images for reality. Since the Renaissance inventions of perspective and trompe l'oeil to the present day's "virtual reality," there has been a constant effort to find ways to convince the viewer that an image of an object is the object itself.

Great strides were made by Dr. Thomas Furness inventor of the head mounted display (HMD). The HMD, although cumbersome, was a breakthrough in that it harnessed the ability of the computer to generate images on the basis of gestures and actions and allowed a fabricated image to automatically change in response to physical actions of the viewer in manner that mimicked the way the real world responds to such actions. Furness thus demonstrated the importance of interaction and feedback in enhancing the communication experience.

The HMD has a number of limitations, most prominent of which is the manner in which the viewer's head in blindly encased within a helmet. Another shortcoming is the weight (and subsequent fatigue and intrusiveness) of the display system. Removal of the helmet and wearing the display as glasses exchanges the intrusion of the helmet for intrusiveness of the real world upon viewer—still reducing the effectiveness of the illusion of being immersed in the displayed world. This exchanged of one form of intrusion for another only slightly reduces the degree to which a viewer rendered effectively blind to the real world.

In all cases of virtual reality displays (with exception of those that create a virtual exit pupil), since a display in located in close proximity to the eye, the viewer suffers problems resulting from the dissociation of eye vergance (where objects seem some distance from the observer) from accommodation (where the eye is forced to stretch the macula to focus on a screen in close proximity in order to focus the image onto the retina.)

To address the limitations of the head-mounted display, Dr. Furness further created the virtual retinal display (VRD) described in a series of patents ranging from WO 94/09472A1 to the present day U.S. Pat. No. 6,639,570B2. Others with patents in this area include Intel Corporation U.S. Pat. No. 6,474,816B2, the Entertainment Design Workshop LLC U.S. Pat. No. 6,454,411B1, and companies inventing applications to place atop the VRD such as Virtual-Eye.com's vision testing U.S. Pat. No. 6,386,706B1 or into specific devices such as Swisscom Mobile AG EP 1198957B1 for mobile devices and Be Intellectual Property Inc.'s incorporation into aviation masks. The virtual retinal display system is a system displayed in a manner bypassing the eye's lenses, and instead projected an image onto the retina artificially designed to be like one focused by the eye onto the retina. This display addressed the problem of disjunction of vergance and accommodation in traditional displays. This created new problems and challenges in the form of finding a means of scanning extremely small images onto the retina (essentially treating the retina like a micro-cathode of a television and substituting a laser for electron beam). The research and concepts of Furness and others associated with the University of Washington stimulated work on the scanning problem by the Microvision Company on miniature scanning systems such as U.S. Pat. No. 6,140,979A which is further covered in patents up to the present day.

Individuals have been successful in finding a number of means for improving the speed and flexibility of scans, most common is that typical of color television displays where three separate scanning beams are used to generate a single, colored image. In patent application U.S. 2001/0022566 A1 (Yoji Okazaki) describes the use of three separate lasers to produce the three different wavelengths for a color display. A method taught by IBM patent GB 2 297 422 A (John Beeteson and Andrew Ramsay Knox) is a form of pixel astigmatism, where pixels to allow to be of nonuniform size to facilitate painting a larger area in a given amount of time. Another recently issued patent U.S. Pat. No. 6,628,446 B1 (Arie Shahar and Nira Schwartz)—typical of a class of solutions—teaches using multiple beams and lenses rotating at standard speed or double speed. A patent U.S. Pat. No. 6,184,969 B1 (James L. Fergason) teaches using active and passive dithering to enhance the display, getting around the limitations of the scan by providing additional pixel enhancement as appropriate. Another method is taught by GB 2 284 902 A (Paul May, Michael Geraint Robinson, Craig Tombling, Edward Peter Raynes) where multiple electro-optical liquid crystal display devices are integrated to allow additional flexibility in image pixel addressability.

All the display solutions continue to be limited by the concept of creating images by scanning, that is by changing the elements of the image in a spatially and temporally sequential manner. More to the point, the real world requires a standard fixing the spatial location of a image pixels of particular size and to be refreshed at fixed times and for fixed duration and display shave sought to ameliorate the obvious constraints of scan display systems while maintaining some continuity with existing standards.

PROBLEMS TO BE SOLVED BY THE INVENTION

A first problem with any dynamic display, but especially virtual retinal displays, is that scanning (such as scanning a beam across the retina) innately results in the creation of gaps in time-time gaps that by necessity interfere with the illusion of reality when such is the goal of the display system.

A time gap occurs in the sequence of images I(n) between the beginning of creation of an image $I(n=n_1)$ and end of creation of the previous image $I(n=n_1)$. For example, causes of this sort of time interval gap are the spaces between the negatives in movie film.

In this case, all the pixels of the image are simultaneously updated (by having the projector light up the film), but the time between updates (approximately $\frac{1}{50}^{th}$ of second with a 180° shutter per 24 frames per second for traditional film) is large relative to the refresh rate of the human visual systems where micro and minisaccades (which are generally associated with the twitch muscles of the oculomotor muscles) occur at frequencies between 40 and 150 Hz (cycles per second)—with the blanking interval a fraction of that response time. For a sense of the time granularity of the visual system, in the paper "The Attenuation of Perceived Image Smear During Saccades" (*Vision Research* 41, 521-528, Bedell, H. E. & Yang, J. (2001)), a flashed light spot during eye movements is used to leave a light trajectory on the retina. The longer the light-on time, the longer the trajectory is. The perceived length of the trajectory is called image smear. Results showed that the image smear increases as the light-on time increases when the light-on time is around 20 msec or less (although suppressed after this point and then increasing again after the 40 msec point).

In electronic display systems, another cause of a time-gap is the blanking (the turning off of the electron beam that is used in the case of an electronic display to activate the phosphor on a screen to luminance) interval inherent in creating images for an electronic display such as a television and computer displays from days when the electronic blanking intervals just mentioned are required since having the gun on as it returns to the beginning point of its line (horizontal blanking) or image (vertical blanking) scanning sequence after rendering an image (called fields and frames in the art of television raster display) would cause an objectionable lines to appear through the image. Current technologies now continue the tradition because of a perceived need for backward compatibility and the use of this blanking interval for other functions (such as foreign language subtitling, text and other information found useful for enhancing or customizing a broadcast).

Similarly, since the sequential scan of a television display is line by line, another cause of time gap occurs because every line of image begins on the same side, the beam is blanked during the horizontal retrace of the beam from the end of each line to the beginning of each new line. All this material is extremely well know to those familiar with the art of electronic displays such as CRTs (cathode ray tubes).

An additional time-gap drawback of current electronic scan systems (such as television) occurs during capture. This time gap translates into a problem at display. Because action often continues while a point by point scan of an image proceeds (as a beam queries a capture plate one capture pixel at a time), when action at high rates of change (relative to the scanning beam) occurs, blurring or smearing appears in the display (the captured pixel associated with a single point on a moving object appears in multiple locations in the captured image.) A display that refreshes at a much higher rate (in conjunction with a continuous capture system) offers the option of having a display of the real world with much diminished motion blurring within certain perceptual limits.

The faster still images are captured and generated, the closer the resulting display conforms to widely held expectations of real life, up to the perceptual limits of the human visual systems' neurology; these limits being the periods when the eye is moving between (micro-saccades) fixation points in the visual environment. These combined gaps are (in the case of movies) short enough in duration to not produce objectionable flicker. It is known in the art of display technology that increasing the rate at which images are shown while retaining a specified level of resolution, produces an enhanced sensation of realism and immersion— 50 hz television appears "more real" than projected film, and 60 hz video appears more real than 50 hz. The "Showscan" display technology promoted by Douglas Turnbull U.S. Pat. No. 4,477,160 A (Douglas Trumbull) and the liquidated Showscan company was based on the appealing realism of the images produced by showing films at a 50 fps (frames per second) or more (along with the use of 70 mm and high candlepower) rather than the current standard of 24 fps.

Even at high refresh rates (rates at which the still images are replaced by the beginning of the rendering of the next still image), interactions between the neurology of seeing (with microsaccades of varying length) and the display scan of an electronic image (with its blanking intervals of fixed duration and relative occurrence) can create unpleasant interactions for viewers sensitive to high frequency visual transitions.

In addition, "Showscan" was not widely adopted because of the high cost of capturing and storing film images at high rates of speed. At display, the cost of the display system was not rapidly recouped because of the lack of content that used the display system to its full capability. In short, the obstacle of displacing the incumbent slow scan system standard with a higher speed scan system proved too great.

If the perceptual quality problems of scan systems were the only ones, then a higher display frame rate (and solutions seeking to boost the overall refresh rate or to boost the rate at which localized individual pixels are refreshed at different rate within a larger collection of pixels) might be sufficient to sufficiently address the problem; however there are technical problems when such systems are used for "virtual reality" and "augmented reality" and when imaging applications (such as industrial applications using photonic sources to generate products) need to exceed neurological standards for speed of refresh When creating an interactive "virtual world," experience shows that images must respond to viewer actions in a manner similar to the way objects in the actual world respond, that is—creation of an illusion of immersion of a viewer in a virtual world requires an instant visual response. Virtual reality display systems using scanning displays have the limitation that the cumulative time gaps resulting from multiple scanning systems (such as the scanning system for capturing the viewer's input and the scanning system for generating the appropriate output) creates "lag time."

Lag time is a measure of the inability of a system to respond directly to input with an appropriate output. One important element of lag time is the display refresh rate-which limits response by the system to viewer input to the generation of the next image in the display sequence. A perceptual by-product of lag between was is felt (a quick twist of the head) and what is seen (a jumpy or blurred sequence of images) contributes to what is called "simulator-sickness" by those versed in the art of creating virtual environments.

A second and altogether different problem with both head-mounted and retinal displays is that they function by excluding the real world, requiring the actual real environment surrounding the viewer has to be reintroduced as content for the display.

Current products require the use of an additional imaging source (like a video camera) and additional electronics (like video mixer circuits) to allow the combination of virtual objects with the actual visible environment surrounding the viewer, or the substitution of views of the current physical environment of the viewer for the virtual scenes. This adds to the cost, weight and complexity of the system. Problems of having an additional scanning capture system are aggravated by the lag time previously described. Having capture off-axis to the display results in other forms of disparity between what would be seen in an unimpeded and natural manner and what is presented by the display, the address of such disparities requiring additional technology and resulting in additional cost.

Current VRDs that use 2D arrays for display have challenges in placing the display in a precise relationship with the viewer's eye. Patents such as U.S. Pat. No. 6,600,460 (Robert Mays, Jr.) and U.S. Pat. No. 6,229,503 B1 (Robert Mays Jr. et al) for miniature projection displays composed of 2D arrays of miniature VCSELs or U.S. Pat. No. 5,883,606 (Larry Starkes Smoot) and U.S. Pat. No. 6,160,667 (Larry Starkes Smoot) and U.S. Pat. No. 5,499,138 (Yoichi Iba) which use schemes for light modulation via planar arrangements of devices such as LCDs, microlenses and aperture arrays and application U.S. 2001/0028332 (Wouter Roest) which uses polarization and an arrangement of aspherical mirrors and lenses; still suffer from requiring additional steps to bring the light rays from a planar display into proper alignment with eye and neglect mention of any means for the display to use anything other than standard image drivers or formats to facilitate the requirements of the display. These shortcoming continue to require either placing the viewer in an immovable position relative to the display or the beam scanner or having to deal with moving the scanning apparatus in response to head and eye movement—and the resulting host of problems resulting from lag-times introduced by attempting to move the beam scanner so it stays in precisely the correct relationship with the eye.

SUMMARY OF THE INVENTION

The present invention addresses the aforementioned need by providing a scanless display system that projects an image directly onto a retina, comprising a plurality of organic laser cavity devices. The organic laser cavity devices are placed in close proximity to a user's eye, for variably changing individual image pixels; wherein projecting the image directly onto the retina occurs by variably addressing individual image pixel locations and variably changing duration of illumination on individual image pixels upon the retina. Also included are a receiver for receiving transmitted electrical signals that include content information; a decoder for decoding received electrical signals; and a modulator for driving the scanless display under predetermined parameters.

ADVANTAGES OF THE INVENTION

By creating a electronic display system that allows each image pixel of the display to be controlled (turned on and off) independently of surrounding pixels while also allowing any number of pixels (up to the number comprising the display) to be turned on or off simultaneously, the time gaps between complete updates of the image are likely to be of shortened duration and of a duration that can be made of variable length. Allowing the possibility of a refresh rate greater than and congruent with the neurological and physiological refresh rates (such as those due to visual fixation and micro-saccades, a significant decrease in lag times can be achieved, hence this patent suggests this method of generating the display——using the "independently addressable" in space and time method (as opposed to a scan-based, sequentially constrained standard).

Reduction and elimination of lag is a feature especially prized by virtual reality and augmented reality systems designers and is useful to all interactive photonic emitter systems. Lag is a form of inaccuracy that at best causes an uncomfortable violation of reality for the viewer (as either gaps appear in what would normally be continuous motion or as perceptible synchronization problems between a viewer action and the result) and at worst a physical liability (if the system is being used to physically effect living cells).

The device has greater flexibility of response to change in the content, the viewer, viewer input or the viewing environment since the display response can be greater than that of current displays and range from changing the entire image in parallel to independently modifying only the smallest, individual image pixel and a rate far less limited than current scanning displays. This scalable response allows the display to taker fuller advantage of data compression schemes thus being efficient in making use of the benefits of "change based" data compression schemes by matching them with a change based display scheme.

Variable speeds can be used during viewing giving the display designer and the viewer (allowing user selectable variable display refresh rates) and other yet unspecified new options in viewing image content.

Being able to alter the image pixels (the smallest units) of the image on a non-sequential basis allows for the possibility that the display may be automatically altered during the varying periods of saccadic suppression thus eliminating perception of non-content screen alteration.

By modulating the lasers individually, the problem of synchronization with the scanning standards of other devices is eliminated because any scanning system may be emulated. The display device can be driven by any image source for which a translator is created (that is a decoder/encoder to convert from the content's scan based standard to the "independently addressable" standard.) This makes the display capable of showing content in all current (and often incompatible) scanning formats.

For an emissive source of the photons that will render the image pixels visible to the eye, currently organic vertical cavity surface emitting lasers (also herein referred to as organic VCSELs or organic laser cavity devices and used interchangeably) are small and capable of being excited ("pumped") by low levels of incoherent, excitatory light making them advantaged for a small and light display. Organic VCSELs gain this advantage in low excitability in part by being composed of a sandwich of materials that enable emission in a region of the spectrum (for example red/640 nm) well separated from the pump wavelength (for example blue/400-420 nm). Other aspects of Organic VCSELS are described in U.S. Pat. No. 6,658,037(B2). Inorganic VCSELs may follow in the future.

Another advantage is that organic VCSELs can be easily fabricated into arrays of individually-addressable elements. In such arrays, each element would be incoherent with neighboring elements and pumped by a separate pump source (e.g. LED or group of LEDs). The elements in the array can also comprise multiple host-donor combinations and/or multiple cavity designs such that a number of wavelengths can be produced by a single array.

In addition, organic VCSELs can be fabricated to provide into arrays of fixed illumination LED pumps. Such a configuration would function by having the output of individual lasers modulated by either controlling the lasing function of the cavities or my controlling the output following lasing.

VCSELs may be fabricated to be of small size, allowing dense packing sufficient for an acceptable resolution display and allowing the creation of a virtual retinal display that is small and lightweight—important features in attaining the desirable goal of placing the display in close proximity to the eye and yet not be tiring while worn for prolonged periods. Such a display close to the eye possesses and advantage in that it will appear to be as immersive (appear wherever the user looks and have a wide field of view "viewing angle") as a comparable display at a greater distance but will be far smaller and will be far less costly to manufacture and require far less power and be innately far more mobile.

In addition to allowing a display to have the just noted desirable features, although the system may use any display technology (including display technologies using direct electrical excitation to cause photonic emission) by using organic VCSELs (or any laser technology having the following features of organic VCSELs) the invention can use incoherent pump light sources of far lower intensity than that of current lasers to offer options that allow construction of a display that is safe for use in close proximity to the eye.

Organic VCSELs fabricated into arrays of individually-addressable elements are more likely to be readily fabricated to have the preferable spherical shape. The organic VCSEL design is likely to be readily fabricated in nonplanar forms because the layers comprising the laser cavity are amorphous and not crystalline making deposition on nonplanar surfaces more facile. Sphere segments are the preferred embodiment for this display for the purpose of simplifying the task of tracking the eye and display an image onto the eye where the geometric relation of the emitted beams to the eye is at all points the same The present invention is further advantaged in implementing solutions to the problem of current VRD systems, keeping the projection scanner in a precise relationship with the retina while the eye (and thus retina) are constantly moving and in using this movement to the advantage of the display system. Unlike current devices, this device—by being able to respond to a change in relationship between the retina and the display's emission source by rapidly altering the choice of image pixel emission sources—is not restricted to changing the image as a whole; the high refresh rates and independent addressability make this display advantaged for implementing what is known in the art of displays as "foveated" imaging. By tracking eye movement, only those parts of the display that are being looked at need be active, and only those parts of the image being looked at by the high resolution portion of the eye (the fovea) need be refreshed at the highest rate of which system is capable.

A display worn over the eyes creates a hazard by blinding the user to the surrounding environment. Inversely, there may be times when having a clear and real-time view of surroundings is desirable but where actual direct viewing could be dangerous (because of hazardous chemical exposure or danger of blinding due to sudden and intense eruptions of radiation).

An organic VCSEL retinal display could create the illusion of transparency without the problems commonly associated with externally worn cameras. Because organic VCSELs currently allow incoherent light to act as a pump light source (and inorganic VCSELs may do so in the near future) and because they have a low pumping threshold, organic VCSELs can use incoherent light to assist generating a display, even to using the image information in the viewer environment in combination with the incoherent light in the scene to drive the individual laser/pixels of the display. By switching between using the qualities of light in the viewer's actual visual environment as modulation of the organic VCSEL and having modulation information come from any other source (for example through the use of micromechanical optical components and additional pump light excitation capabilities); the display would be able to flexibly and dynamically combine the illusion of direct viewing of the world surrounding the viewer (that is, would be as thought the display has somehow become all or in some parts, transparent) with display of images of imaginary, virtual, remote in time or place or abstract images.

Organic VCSEL technology also has the advantage of relative ease of alignment of pump source to output laser, important in rendering an accurate image onto the retina.

The benefits of motion image compression for transmission and storage are obvious and have resulted in many standards and patents (a search on the terms compression and encoding will yield over a 1000 patents in the last ten years) covering the conversion of motion image information into a compressed form. MPEG, Quicktime, CU-SeeMe, RealVideo, H.320/H.261, motion JPEG 2000 and JBIG are some widely known to those versed in the art of motion image compression. Some of the techniques (such as those used by JPEG 2000 and belonging to the broad class of "wavelet" compression schemes) use transform coefficients to compress image information by quantizing the coefficients on the basis of histogram information using a mathematical technique such as Huffman Encoding. The combination of broad wave information modified by a decoded "signal" that's modifies the broad wave information allows for the rebuilding of the original wave and for the compression and decompression to occur.

Compression by using what has changed in the image is not unique to wavelet compression, and is a familiar tactic in a variety guises to those versed in the art of using information encoding for the purpose of image compression and decompression (CODECs). Since this display is advantaged by allowing each image pixel to be independently addressed, it's efficiency in being driven by the change data (as opposed to recreating a raster by converting the change information of individual image pixels into elements in a sequentially scanned array) will likely cause it to be preferred over competing displays for all forms of compression motion imaging.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 5 illustrates the inward (eye) facing portion of the hemisphere of FIG. 3.

To facilitate understanding, identical reference numerals have been used, where possible, to designate identical elements that are common to the figures.

DETAILED DESCRIPTION OF THE INVENTION

The present invention is a virtual retinal display system that addresses the preceding problems by using an array of lasers. Each laser in such an array being addressable individually and in parallel (rather than sequentially) in time and location, thus creating a scanless virtual retinal display. The lasers in the array having qualities typical—and currently unique to—organic VCSEL devices, also herein referred to as organic laser cavity devices and used interchangeably—each such laser requiring extremely low levels of incoherent light as a pump source, easy formation into arrays of non-planar shape, and having both low power and small size which are appealing to display devices that will be used to scan onto the retina. Such a VCSEL is described in U.S. Pat. No. 6,658,037 B2 (Keith B. Kahen et al.)

Figure 1:
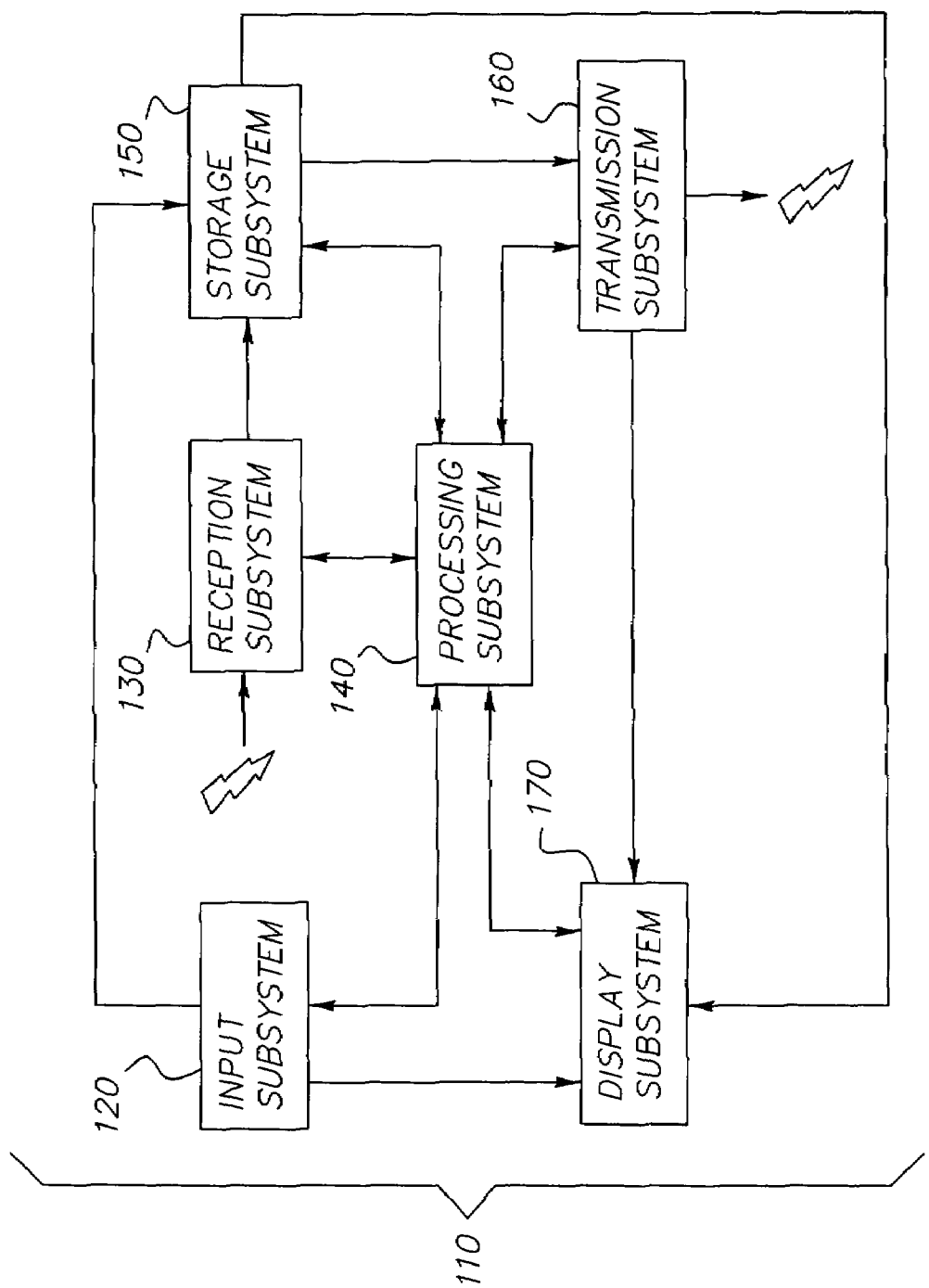
FIG. 1 is a block diagram of components for a retinal display system that projects light rays directly onto a retina without using a scanning system in accordance with the present invention.

Referring to FIG. 1, the scanless retinal display system 110 is composed of subsystems typical and familiar to those versed in the art of assembling immersive display systems; such systems typically comprising subsystems such as input subsystems 120, data reception subsystem 130, data processing subsystem 140 and storage subsystem 150, as well as data transmission subsystem 160 devices and displays' subsystem 170. It is understood that when the patent refers to these subsystems in the singular (transmission, processing, storage) that one or more physical devices may constitute the subsystem.

Note that for a stereoscopic display, the system is extended to two separate displays for the left and right eye receiving content appropriate to the left or right eye.

Note also that for greater immersion, engaging the other senses with additional devices (such as loudspeakers, earphones, tactile feedback, smell, temperature, motion etc.) is recommended and will not be mentioned further.

Those devices requiring electricity to function (such as the computers used for data processing subsystem 140 and devices part of the storage subsystem 150, transmission subsystem 160, data reception subsystem 130 and sensors in an input subsystem 120 and—in most embodiments—the displays' subsystem 170 are assumed to use alternating or direct current power supplies that are commonly available for the purposes of powering such devices. Power supplies and power delivery were therefore not to be mentioned further except to note the low level of power required by this invention.

The sensors in the input subsystem 120 of the system may include devices such as but not restricted to photosensors (such as organic light diodes) in combination with microlens capture devices, mirrors and similar devices designed to enhance the capture and response to photonic emissions by generating an electrical current, cameras (such as video cameras) designed to respond to wavelengths such as but not restricted to the visual spectrum, IR (infrared), UV (ultraviolet), temperatures sensors, magnetic field, electrical charge, electrical field, accelerometers and other forms of motion sensor, pressure sensors, acoustic, texture and other mechanical sensors. It is understood that these sensors could be mounted on the viewer, the display device and located anywhere in the environment surrounding the viewer as deemed useful.

The data reception subsystem 130 may include but are not restricted to all forms of devices designed to receive and decode signals meant for wireless broadcast reception devices such as mobile phone, television or radio and covering a variety of wavelengths (such as radio, infrared, ultraviolet, terahertz and other frequencies), wired broadcast reception devices such as cable delivered content, data delivered over power lines or telephone lines. Such broadcast content may of any kind currently broadcast such as commercially broadcast content, content from the internet, subscription, private transmissions as well as future forms of broadcast content. In addition, data reception subsystem 130 may be of the form to receive and decode signals from storage subsystem 150 devices meant for the playback of recorded materials on physical media such as DVDs, CDs, magnetic and optical tapes, solid state memory and other forms of storage, as well as signal generated by a computer on the basis of stored instructions rather than storage of the content itself.

In addition to data reception subsystem 130 devices meant to receive data to be displayed henceforth known as content data, are the class of data reception devices for other forms of data such as Global Positioning System (GPS) data for providing the location of the display, the Universal Coordinated Time (UTC) or similar standards (such as Greenwich Electronic Time or the Network Time Protocol) and other such forms of data that may prove useful for the function of the system but which may not be displayed by the system to the viewer of the display.

The data processing subsystem 140 required may be of the form of devices: dedicated or purpose built for the function; of the type of a "personal" computer (typical of which are those computers sold by IBM™, DELL™, Compaq™ and Gateway™); large computing systems such as though commonly associated with the single servers or server farms (such as those provided by SUN™); distributed computing systems where the computation is distributed across more than one device with such groupings being of heterogeneous or homogenous devices in peer-to-peer to hierarchic network topologies; and embedded computing devices such as those designed by Windriver™ for use in dedicated devices such as mobile phones, PDAs, or other devices which use microchips to control functions and any mixture of the preceding.

Data processing subsystem 140 is going to require a storage subsystem 150 to hold the data coming in from sensors part of the input subsystem 120 and data reception subsystem 130. In addition, the output of data processing subsystem 140 will not be simultaneously usable by the scanless retinal display system 110 and will therefore have to be held in storage subsystem 150 until such time as the scanless retinal display system 110 is prepared to apply the output from the processing subsystem 140 to displays' subsystem 170 or to the data transmission subsystem 160. Such a storage subsystem 150 is typically of the form of memory microchips but may also be located on nonremovable media such as magnetic or optical disk or tape.

The data in storage subsystem 150 is accessed by data processing subsystem 140 and, if the data is content for display, is output to displays' subsystem 170 or to transmission subsystem 160 to storage subsystem 150 elsewhere or delivery to remote displays' subsystem 170. If the data in storage subsystem 150 is not meant for displays' subsystem 170, then it is sent directly to transmission subsystem 160 to be used by other subsystems of the system, such as subsystems containing devices for telemetry or other functions related to the creation interactions deemed useful by the builder of the system.

Figure 2:
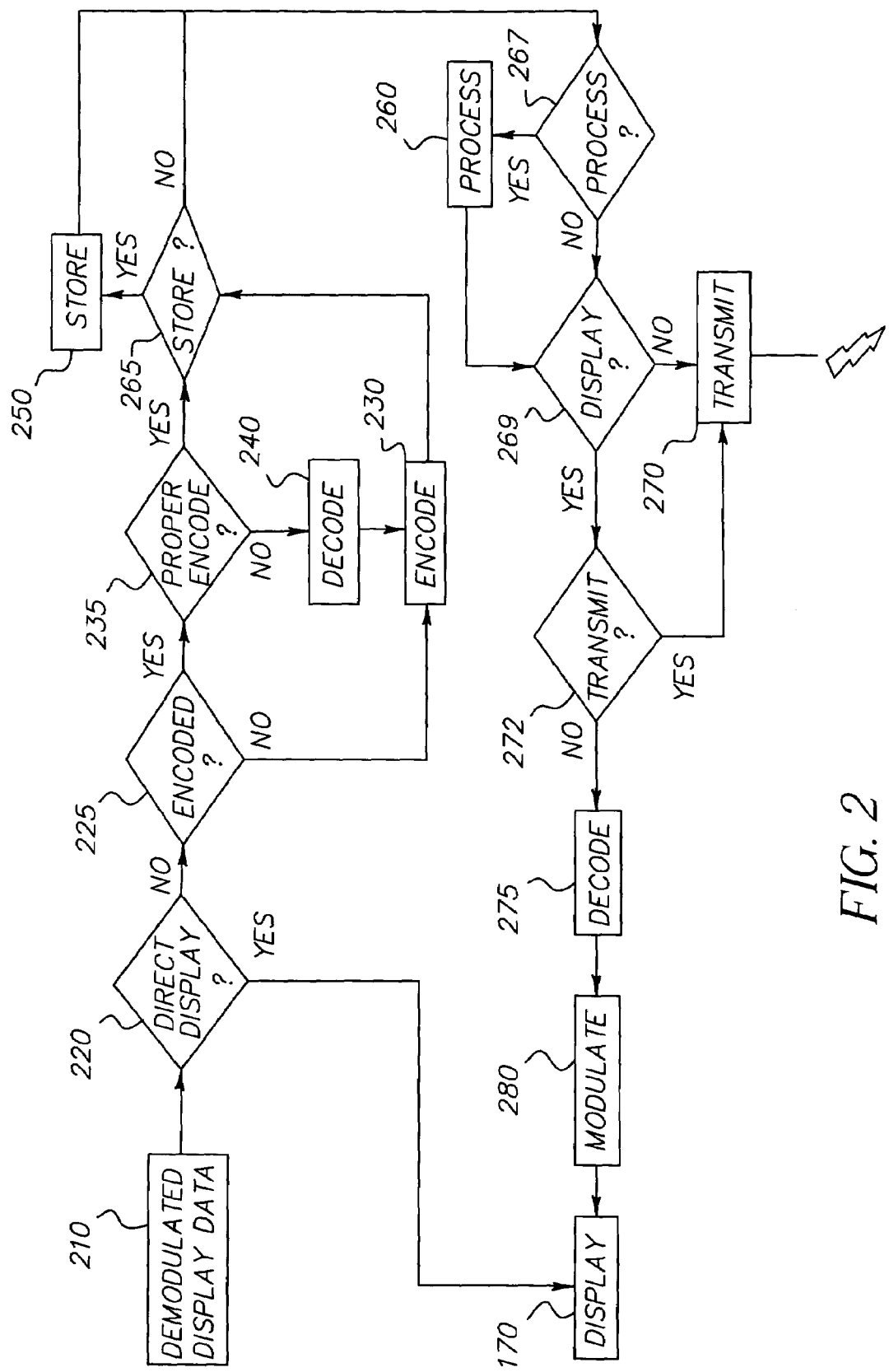
FIG. 2 is a block diagram of the function of the system of FIG. 1.

FIG. 2 shows a block diagram of the functions the scanless retinal display system 110 subsystems are designed to provide. The scanless, retinal display system 110 functions by initially receiving the display data input signal 210 generated by the sensors in the input subsystem 120 and data reception subsystem 130.

It is determined 220 by the design of the particular embodiment of the scanless retinal display system 110 if the input signal 210 should be sent directly to the displays' subsystem 170 or to processing subsystem 140.

If the signal is to be sent to processing subsystem 140 and it is determined to not be encoded 225 then it must be encoded 230 per a coding/decoding convention (henceforth referred to as a CODEC and typical of this class being the IEEE 1394 standard otherwise knows as "Firewire") used by the system. If the data encoded in an incompatible format 235, then it must first be decoded 240 so that it may be re-encoded 230 for use by the scanless retinal display system 110. The encoded data may be stored 250 in storage subsystem 150 where it may be processed 260 by processing subsystem 140 or it may sent directly to displays' subsystem 170. Processing 260 the data may require transformations of the data, or it may (rather than storage) be nothing more than the retrieval 265 of the data from storage subsystem 150 and deciding not to process 267 or display 269 and to instead go to transmit 270 the data to a different subsystem of the data processing subsystem 140 for the purpose of decoding 275 and modulation 280. One example of such route is when the output from processing subsystem 140 is transmitted 270 to the displays' subsystem 170 where the output is decoded 275. Upon decoding 275 the data input signal 210, the instructions contained in the code are applied directly to a displays' subsystem 170 subsystem capable of modulating 280 a signal to drive the displays' subsystem 170. The system may choose to both transmit data as well as display 272 as in the case when multiple displays with different processing requirements are being used.

By modulation is meant causing a laser to emit, to stop, change amplitude of the emitted beam, and may include additional laser-beam characteristic altering commands. This figure illustrates the process for emission and cessation of emission by the laser without consideration of the mechanism employed to cause (or create the functional equivalent of causing) the laser to emit or cease firing.

Although the broad definition of the scanless retinal display system 110 and its subsystems is familiar, the preferred embodiment of the system is original and unique due to the manner in which the displays' subsystem 170 is driven by the data (that by addressing the image elements of the display individually and in parallel), the manner in which the displays' subsystem 170 creates an image (by simultaneously generating rays of light designed to converge on the retina), the problems (such as laser display specularity) addressed by not scanning the entire image onto the retina (but only those parts at which the fovea is pointed,) modifying the images in a manner appropriate to the specific target onto which the display is directed (to create illusions of focus appropriate to monitoring the focusing and vergance actions by the eye), and the manner in which the displays' subsystem 170 is excited.

Figure 3:
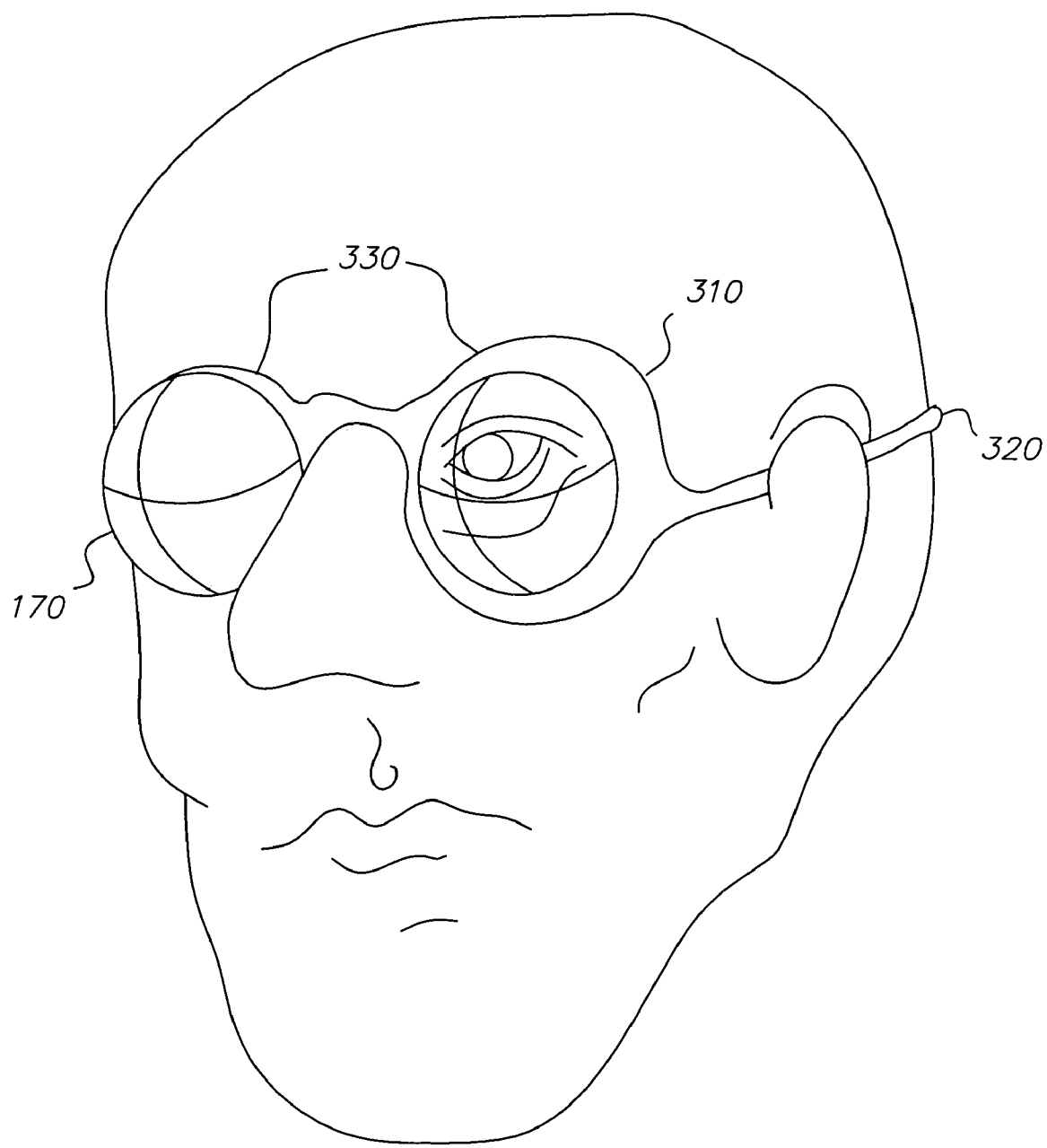
FIG. 3 is a perspective drawing of a head-mounted hemispherical, scanless, retinal display system.

FIG. 3 shows a preferred head mounted structure 310 of the display subsystem 170, where a hemisphere (or some segment of a hemisphere) shaped display 170 is held by a frame 320, strap, adhesive or other means (except in those cases where the design of the display is small enough to be worn like a contact lens) close to the eye 330. In addition, the display 170 can be larger, planar, or be used in conjunction with reflective surfaces (such as mirrored hemispheres, cube-corner reflective material) beam-splitters and other means of optical redirection including all manner of conventional and unconventional lenses (converging, diverging, spherical, aspherical, and including lenses of all materials and configurations such as Fresnel, linear Fresnel, lenticular, prismatic, and those using negative refraction) and apertures to redirect the output of the display 170 to the retina.

Figure 4:
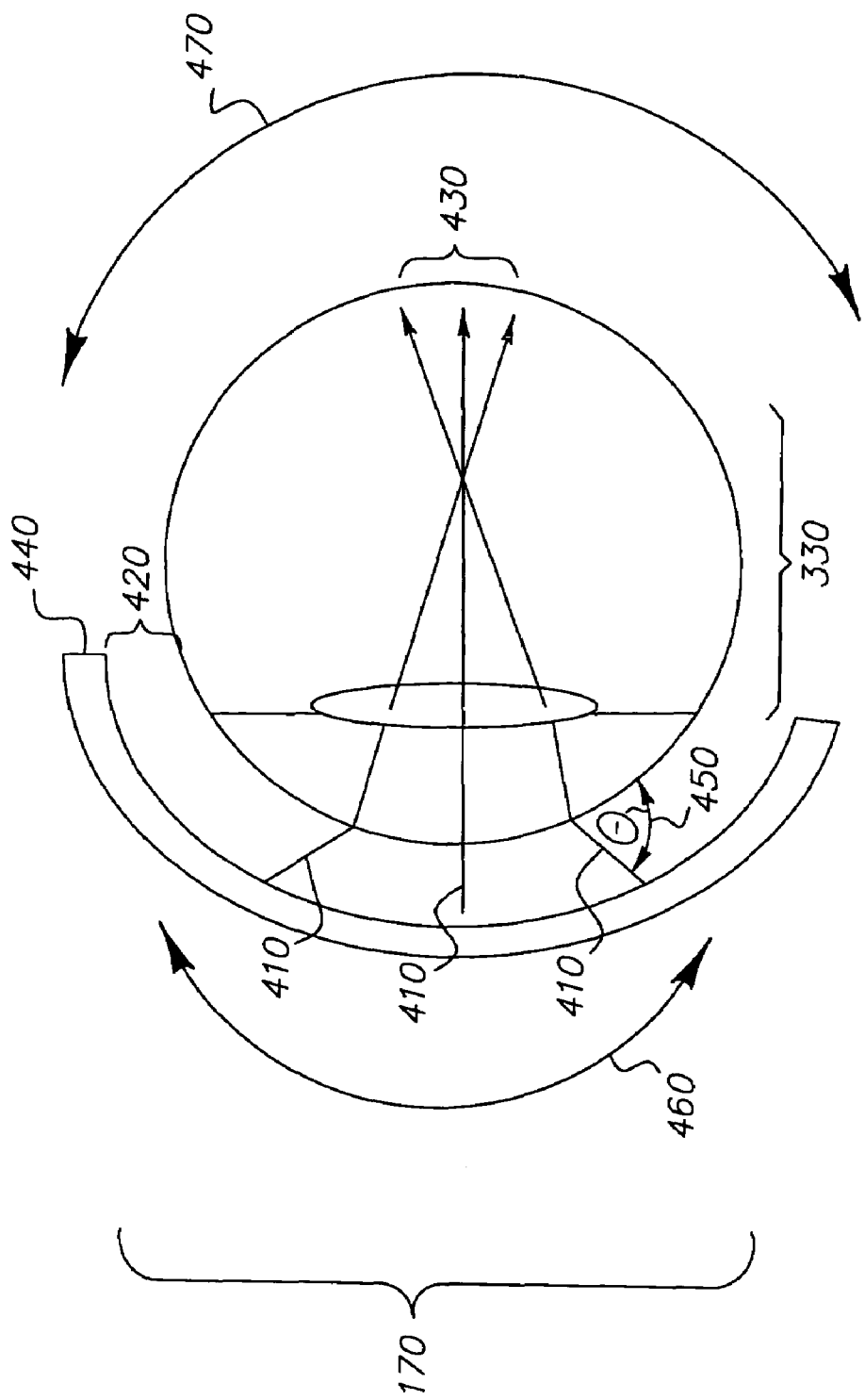
FIG. 4 illustrates tracing light rays from the display to the eye for a retinal display as used in the prior art.

FIG. 4 shows how the lightrays 410 projected by display 170 traverse a short distance 420 directly onto the retina 430 of the eye 330 and how using a display 170 with a hemispherical substrate 440 display 170 has all image pixel generation occurring tangentially 450 to the surface of the eye 330 allowing creation of a display with no geometric distortion and capable of a very wide field of views "FOV" 460 (equal to or greater that the eye 330) and an instantaneous field of view 470 (which is an image plane contained within the eye 330) with a minimum of material, faster response, and requiring less energy than a similar display of larger size.

FIG. 5 shows a design that allows for currently commercially available emitters/sensors combinations 510 appropriate to imaging, eyetracking and those sensors part of input subsystem 120 generally sensitive to changes in the eye 330 (such as but not limited to changes of blood pressure, eye dilation, and corneal deformation). These sensor/emitter combinations 510 are located on, in, and below the substrate 440 forming the inward (eye 330) facing side of display 170 along with the image emitting pixel(s) 520. Though the elements are represented as squares in the figure, this is for graphical simplicity and is not meant to imply that the elements are in fact square.

FIG. 6*a* shows a hemispherical design display 170 covering the eye 330 lending itself to population by lenslets 610, photonic sources and light emitting pixels 520 and emitter/sensor combinations 510 of the sort currently commercially available, said emitter/sensor combinations 510 located on in and below the substrate 440 on the side of the facing outward (away from the eye 330) and useful for image capture, motion tracking and general information capture about the environment. This population of outward facing sensor/emitter combinations 510 is useful for implementing a design that enables interaction with immersive what it known in the art of computer displays as augmented reality (that is the displayed fusion of stored or generated imagery with "real-time" imagery of the immediate surroundings).

Figure 6B:
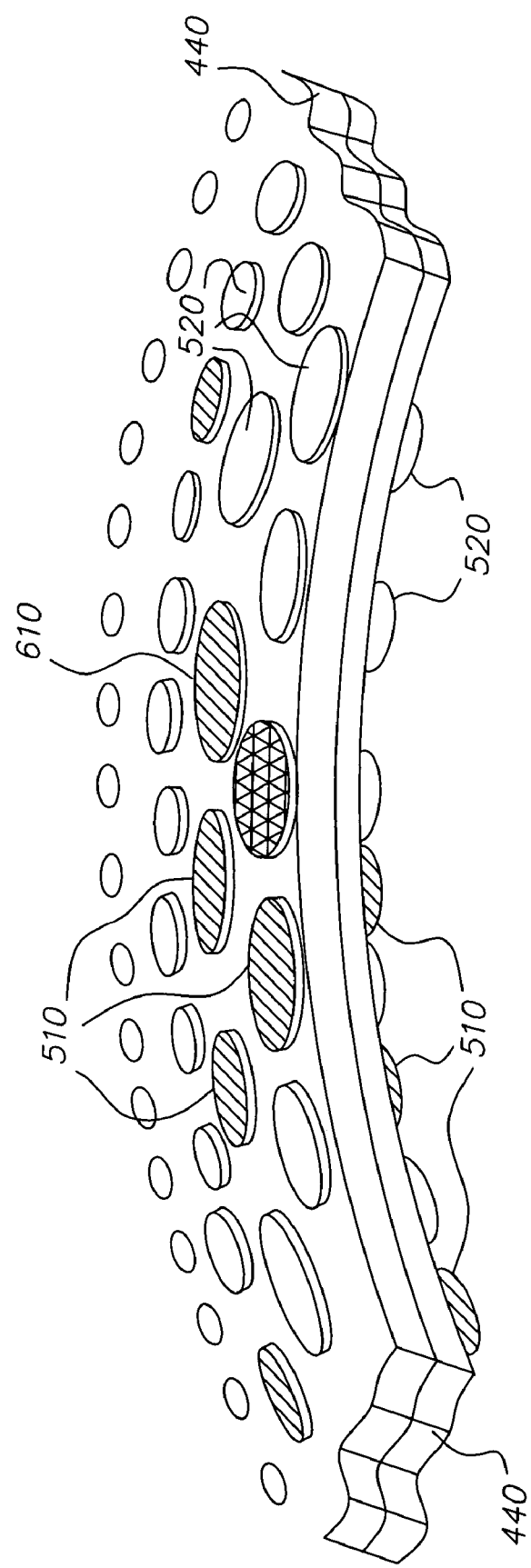
FIG. 6 a,b illustrate the outward (away from the eye) facing portion of the hemisphere of FIG. 3, showing lenslets and sensors intermixed with an array of VCSELs.

FIG. 6b shows an on edge view of an array of individually addressable light pixels 520 and emitter/sensor combinations 510. The individually addressable light pixels 520 may emit light of different wavelengths to create colored images or to provide metric, sensory or therapeutic functions. Though the elements are represented as round in the figure, this is for graphical simplicity and is not meant to imply that the elements are in fact round.

Figure 7:
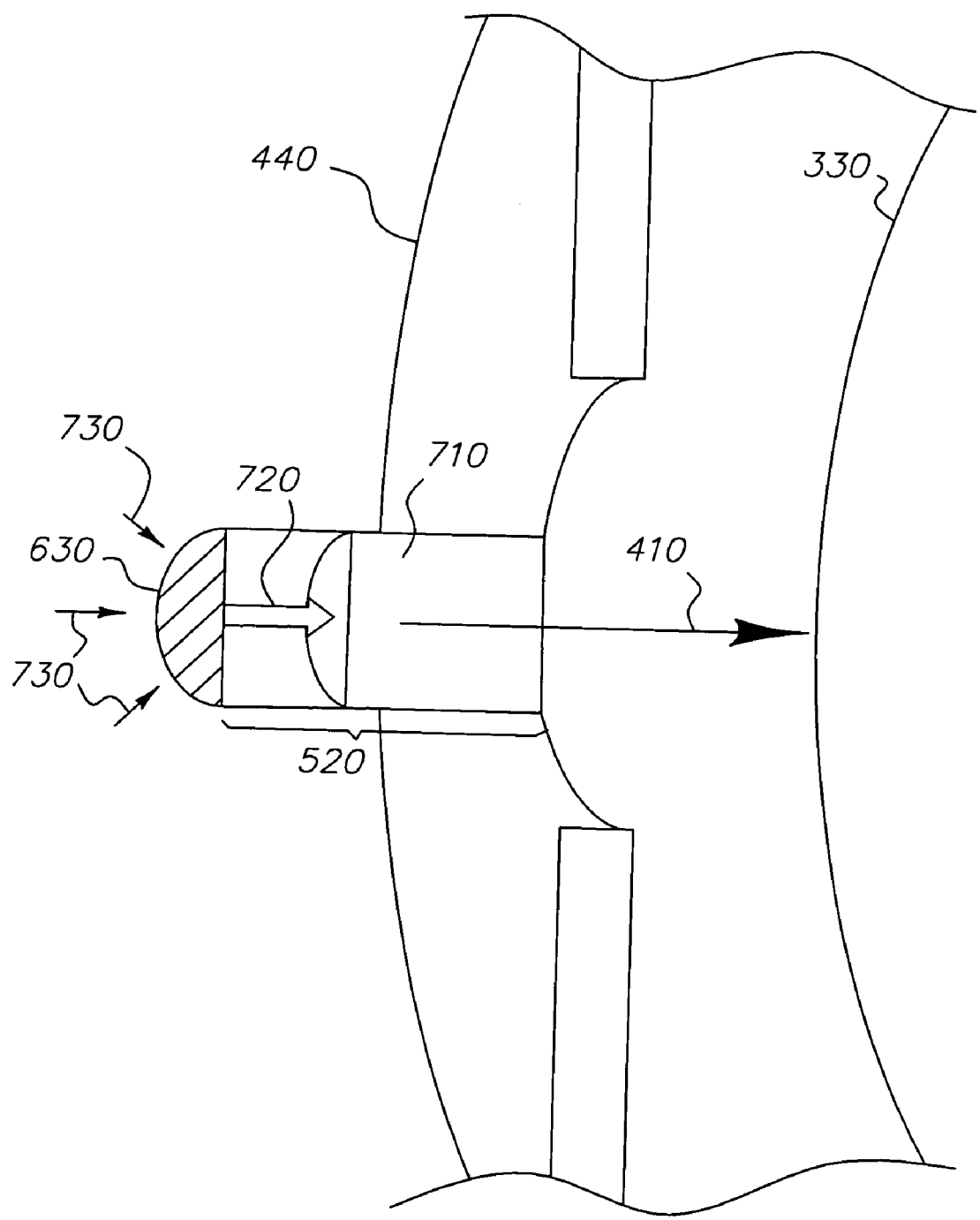
FIG. 7 is a schematic drawing of an ambient light pumped organic VCSEL using a lenslet.

FIG. 7 shows a schematic of a natural light (likely in the blue wavelength since currently actinic wavelengths are optimum for excitation) pumped organic VCSEL 710.

An individually addressable light image pixel 520 includes an organic VCSEL 710 that is optically pumped by light 720 produced by a lenslet 610 assembly in a substrate 440. The lenslet 610 assembly condenses the ambient light 730 and focuses the light upon the base of the organic VCSEL 710 creating a pump source. Organic VCSEL 710 in turn emits laser light 410 perpendicular to the substrate 440, said light traveling to the eye 330. Substrate 440 is useful for keeping all the elements in proper optical alignment amongst other things.

Figure 8:
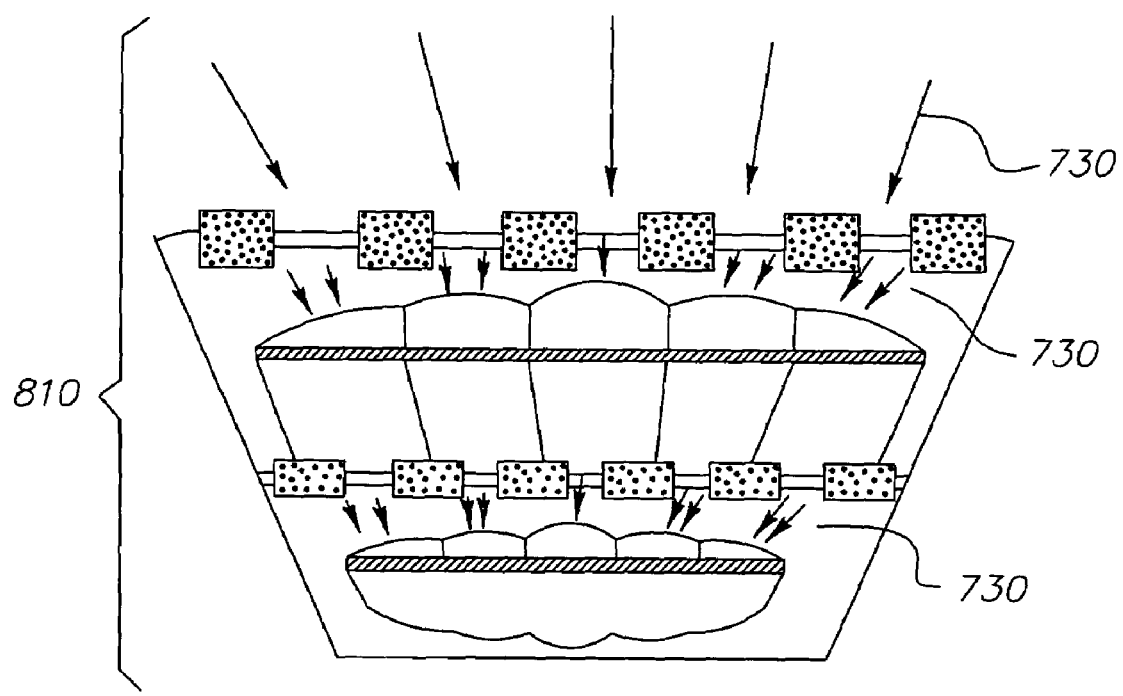
FIG. 8 prior art—is a schematic drawing of a stacked array magnifier (SAM).

FIG. 8 shows an application using technologies using a stacked array magnifier (SAM) 810 which is a device using microlenslets 610 in combination with optoelectronics to amplify the ambient light available in the environment to trigger a pumplight source for the organic VCSEL 710.

These devices are described in a range of Eastman Kodak Company lenslet array patents by Mark Meyers (as well as others, typical of the which is the patent by Burger WO 99/38046 on lenslet arrays and methods) starting with U.S. Pat. No. 5,696,371A and including U.S. Pat. No. 6,141,048 which describe means by which amplification of photonic input is facilitated by the use of a lenslet array in combination with photodetectors and current mirrors.

Figure 9:
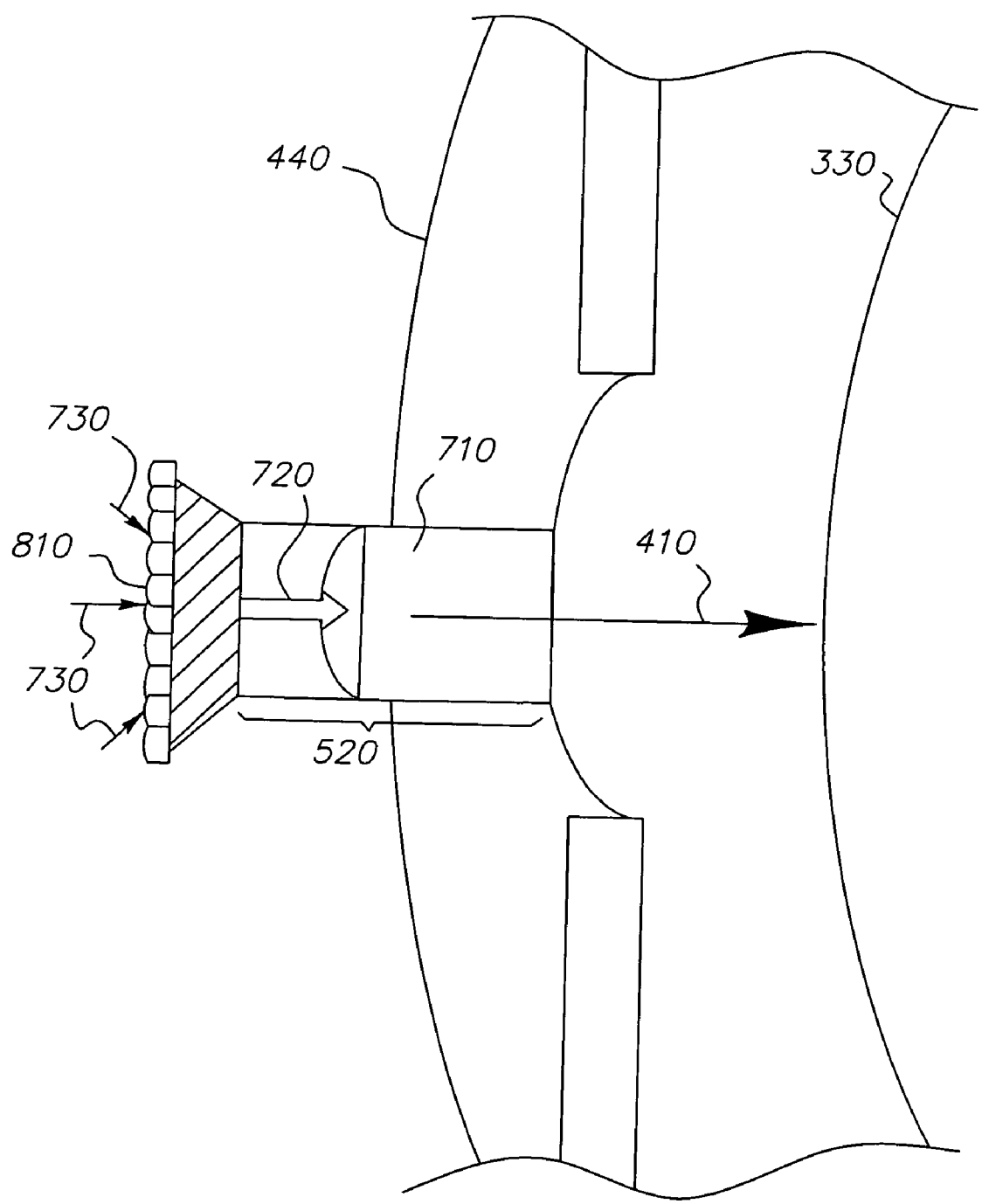
FIG. 9 is a diagram showing a mechanism for pumping a laser with output from a SAM.

As shown in FIG. 9, this application being useful in low light conditions and efficient in taking advantage of the larger surface area available on the outside of the sphere compared to the inner side containing the image pixels 520. FIG. 9 shows a SAM 810 emitting incoherent light 720 to optically pump the organic VCSEL 710 that emits laser light 410 in some angle shown to be perpendicular (but which in the real world will deviate with some characteristic divergence) to the substrate 440. Said laser light 410 traveling to eye 330.

Figure 10:
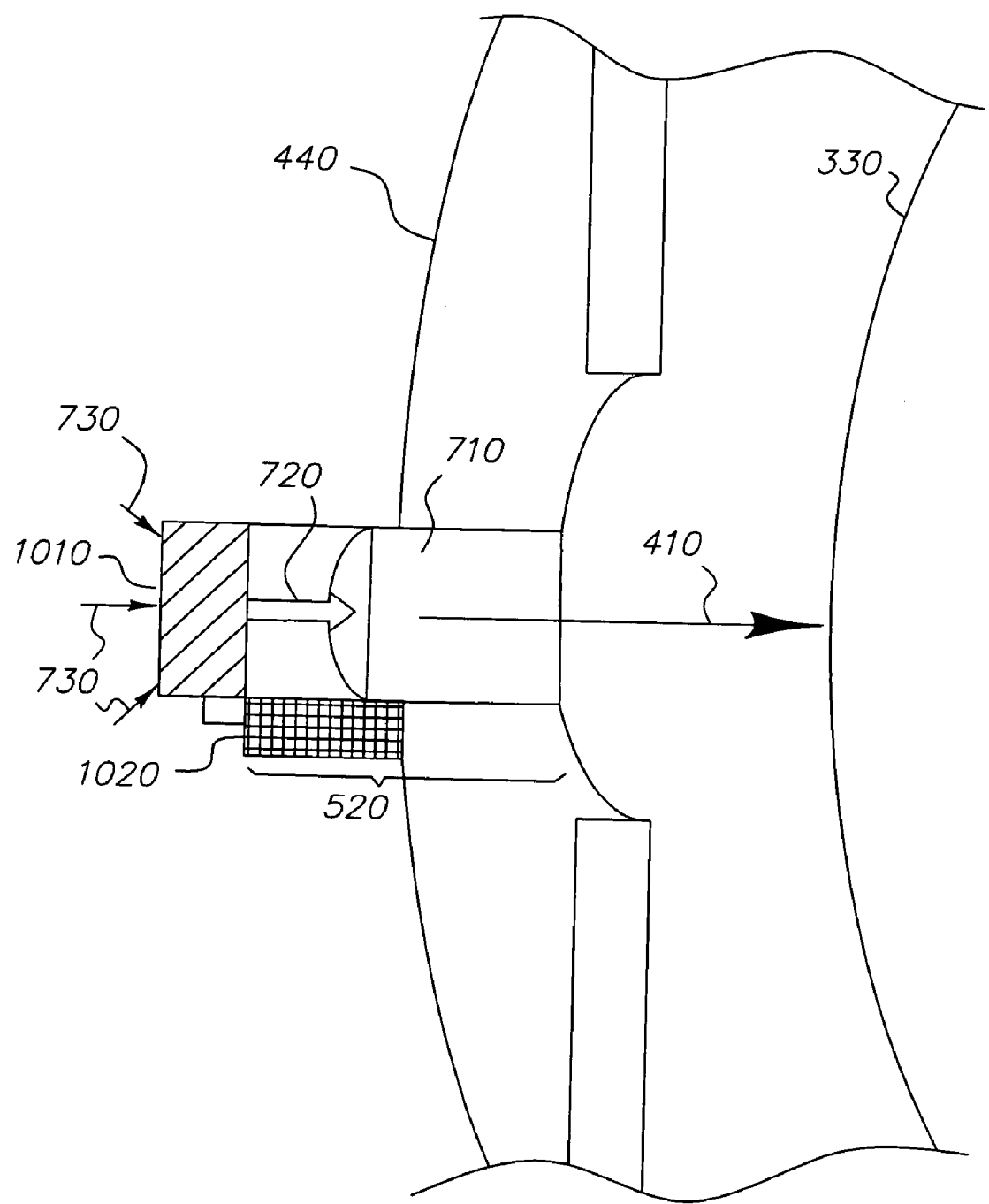
FIG. 10 is a schematic drawing of a cross section of an OLED pumped organic VCSEL, such as those indicated in FIG. 6.

FIG. 10, illustrates an individually addressable light pixel 520 that includes an organic VCSEL 710 that is optically pumped by (for example but not limited to) light from an OLED 1010 formed on a substrate 440 and electronically controlled through a circuit 1020. In a passive matrix display, circuit 1020 is comprised of electrical conductors. In an active matrix display circuit 1020, the circuit contains active electronic elements such as transistors, capacitors (and functional equivalents of those and other components typical of electrical circuits). Note that the light source may be any that meets the requirements for size, brightness and power consumption.

As in FIG. 6 and FIG. 7, the incoherent light 720 is used to optically pump the organic VCSEL 710 that, in turn emits laser light 410 perpendicular to the substrate 440 and which travels to eye 330.

Figure 11:
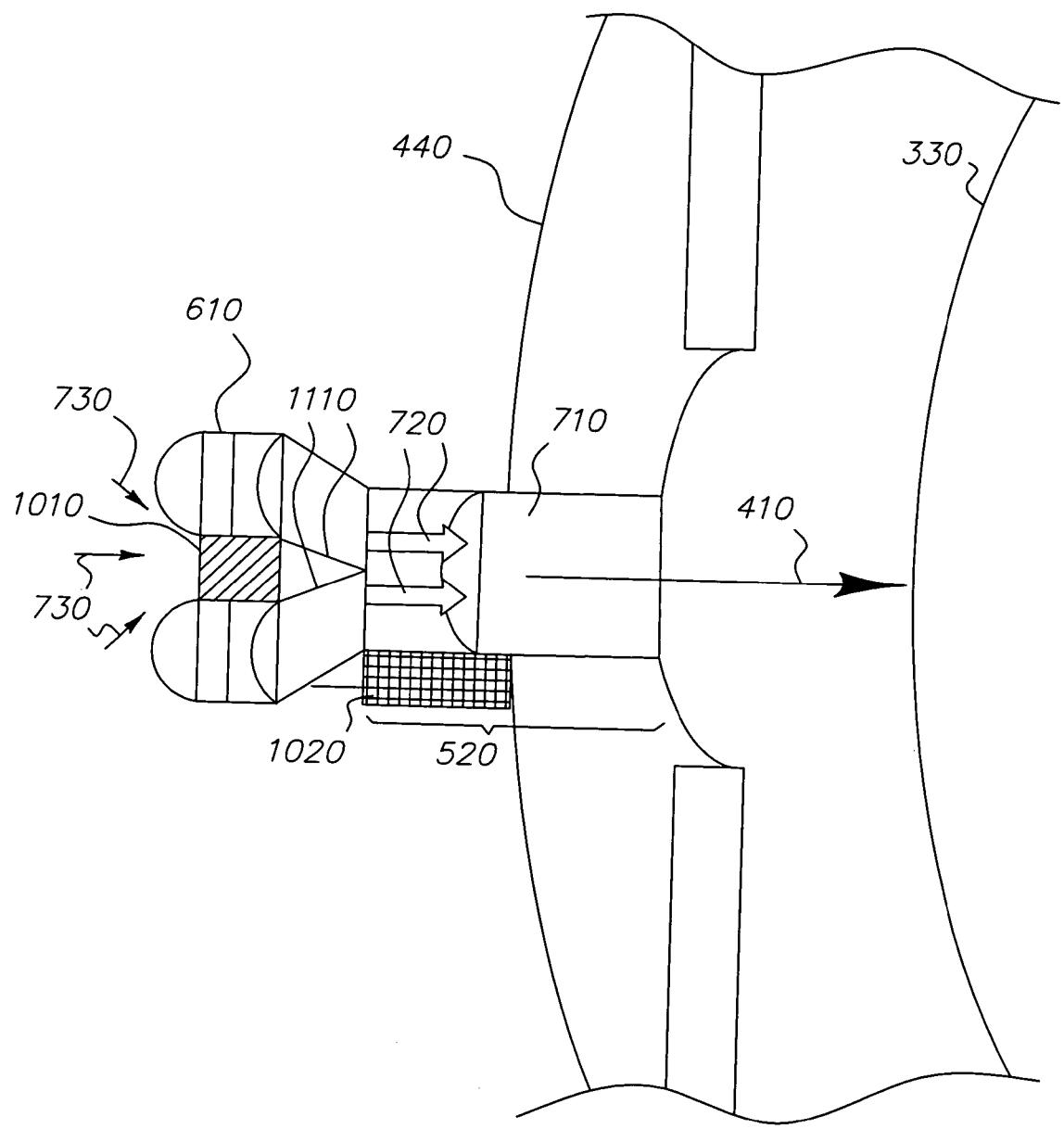
FIG. 11 is a schematic of a switchable source organic VCSEL (switchable between an OLED or ambient light source).

FIG. 11 shows optical elements such as micro beam splitters and micromirrors 1110 may also be used to divide, redirect or combine multiple pumplight sources such as the OLED 1010, and ambient light 730 going to lenslets 610 to achieve the output 410 of the organic VCSELs 710. In this manner, FIG. 11 shows how to freely combine two dissimilar but complementary modes of operation; enhanced display of the surroundings of the viewer and display of stored material. In this illustration, the mirrors in the figure are positioned to direct light from lenslets.

Figure 12A:
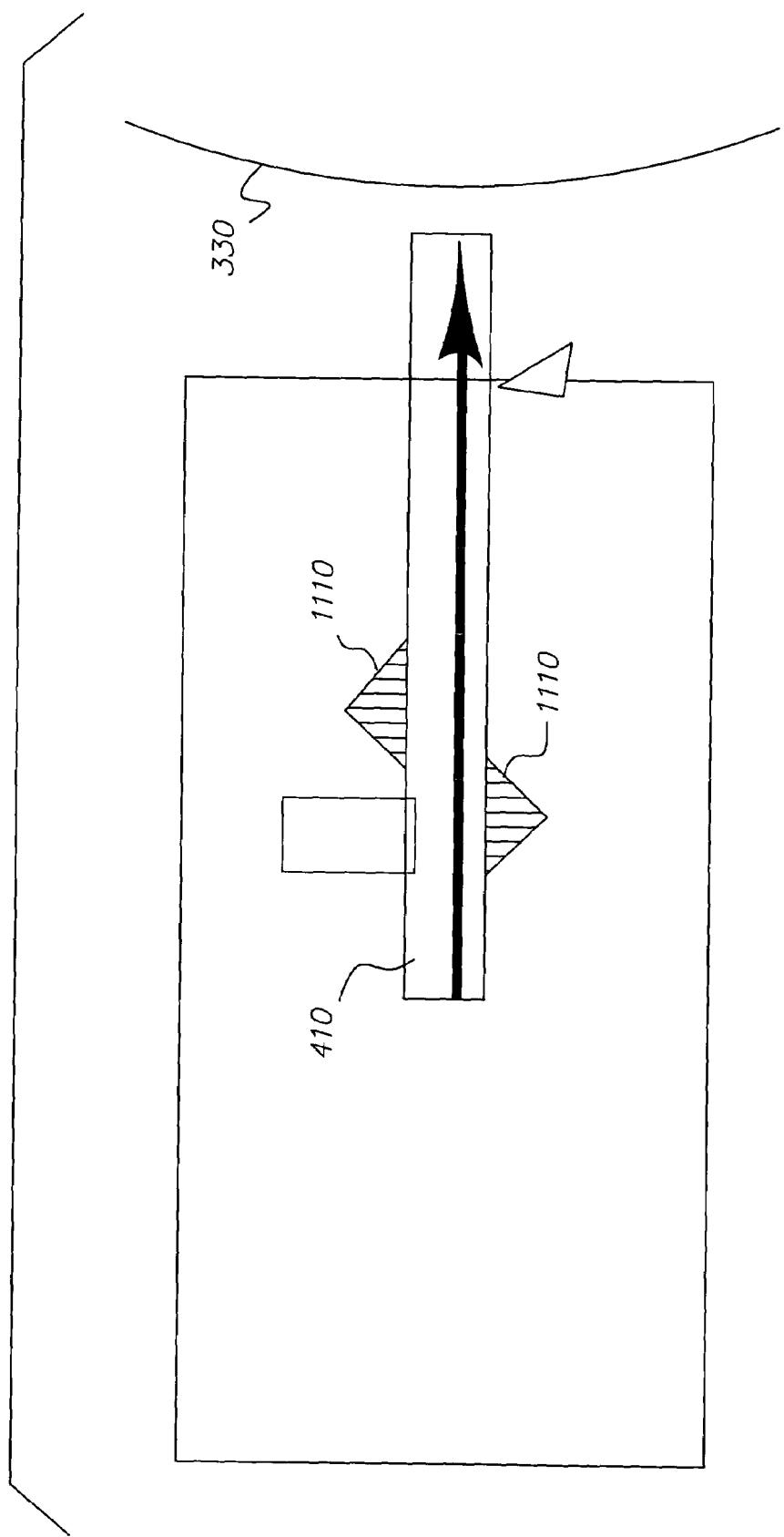
FIG. 12a,b,c is a schematic of a tunable output organic VCSEL (tunable between to create different wavelengths).

FIGS. 12a,b,c shows a means typical of the art of microelectromechanical (MEMs) devices whereby the desirable end of modulating the output may be achieved by positioning an optical element such as a micromirror 1110 in the path of the output laser beam 410 with the intent of providing light "valving" of the beam relative to the eye 330. In this manner, deflection and alteration of the output may be sufficient to make the output 410 invisible to the eye 330.

One example of the last method being patent U.S. WO 95/20811 (Robert G. Waarts) assigned to SDL Inc. where the modulation takes place subsequent to beam formation by the use of electromechanically positioned surfaces that deflect and obscure the output laser beam.

FIG. 12a shows the output laser beam 410 emitted towards the eye 330 in an unmodified manner. The deflecting micromirror 1110 is in a position that takes it out of line with the output laser beam 410.

Figure 12B:
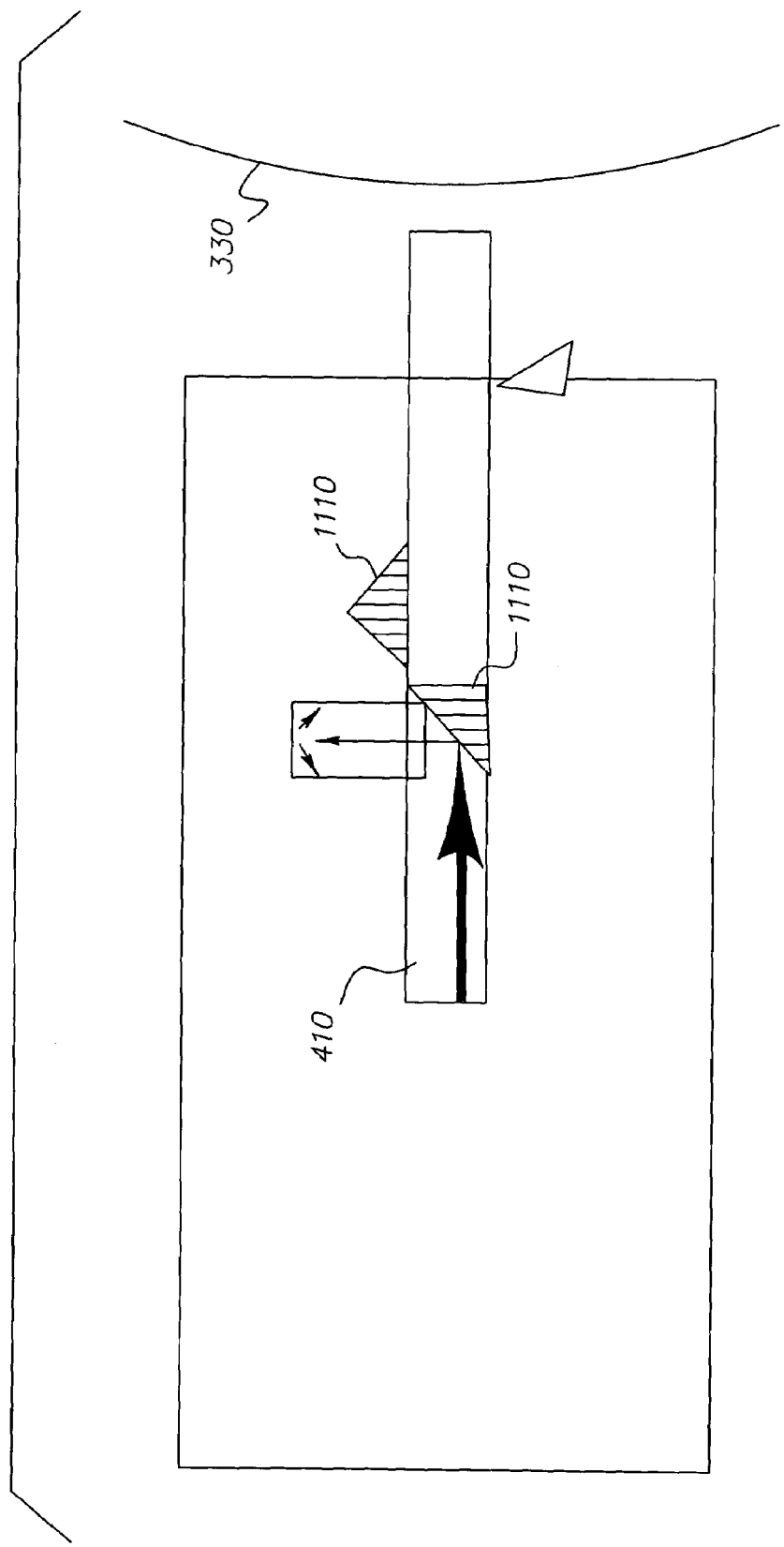

FIG. 12b shows the output laser beam 410 emitted and then deflected by positioning micromirror 1110 into its path in a manner that deflects the beam into an absorbent cavity.

Figure 12C:
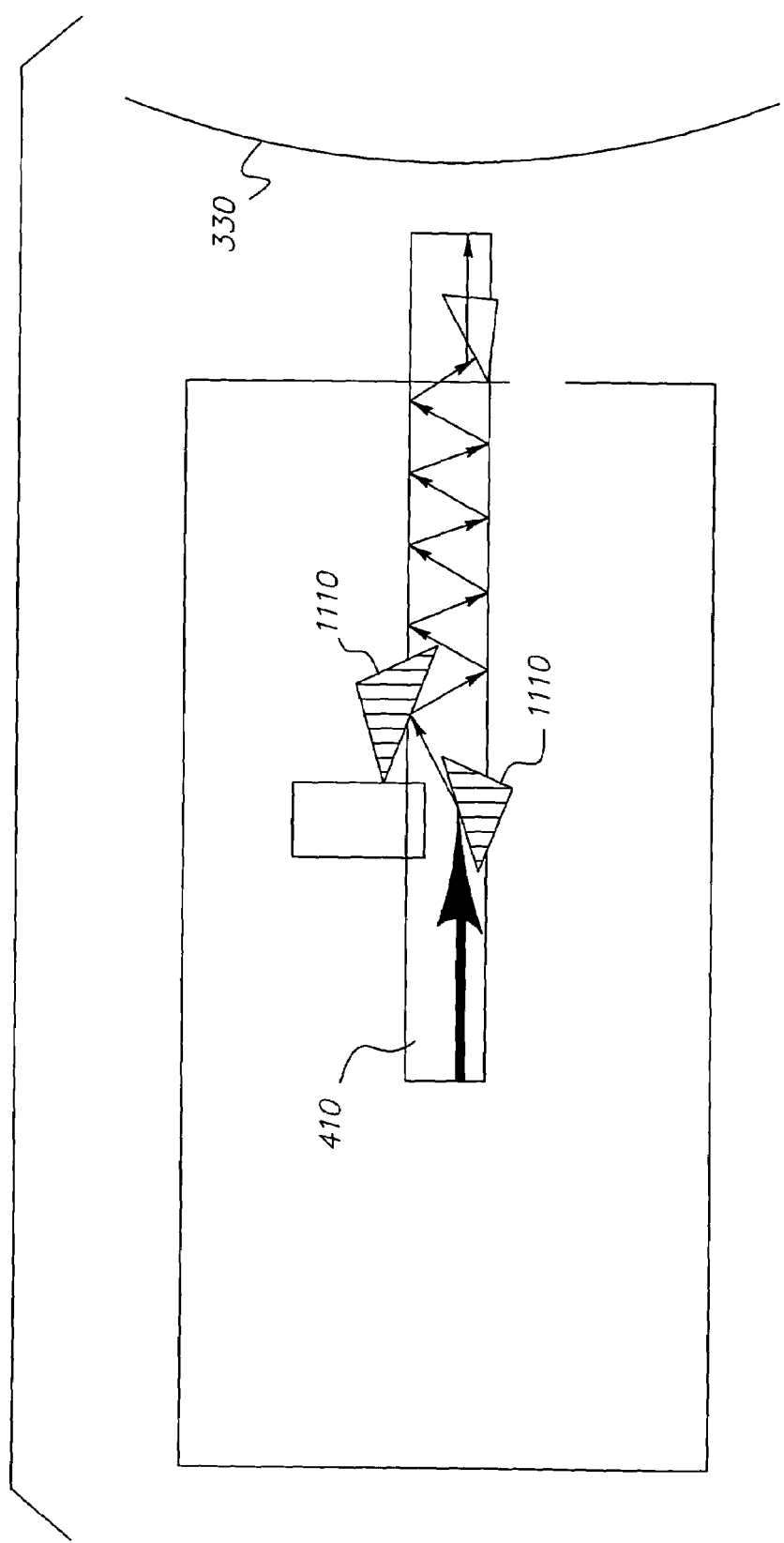

FIG. 12c shows the output beam 410 emitted and the beam path modified by positioning a pair of micromirrors 1110 into the beam path, modifying the characteristics of the waveguide and altering the wavelength of the output beam 410. The output beam 410 still exits the emission cavity in a manner that insures it will intersect the eye 330.

Alternatively, the output may be directed to a colored filter (such as that described in U.S. Pat. No. 4,955,025 (Mears et al)) where doped fiberoptic material is used. Use of such filters would alter the output wavelength from a single organic VCELS 710 source and allow creation of a combination of red, green and blue organic output laser beams 410 to achieve the capability of creating a "full color spectrum" capable display. Other functionally equivalent technologies for modulation include: altering the organic VCSEL 710 cavity (in addition to altering mirrors, altering the length, diameter, shape, texture or other optical qualities or physical characteristics of the cavity) to "tune" the output wavelength (altering its color, polarization or other feature), or by placing a material or object (such as transmissive, liquid crystals "LCs") in the output 410 path. Transflective LCs, (dichroic, quantum dot, or polarizing) filters, (diffracting or holographic) gratings, additional fluorescing dyes, waveguide materials, and other devices (inclusive of electrical, thermal, optical, mechanical and—acoustic) in all permutations are also feasible and part of the known art for tuning the wavelength of laser output and may be used as appropriate for the uses to which the invention will be applied.

Figure 13:
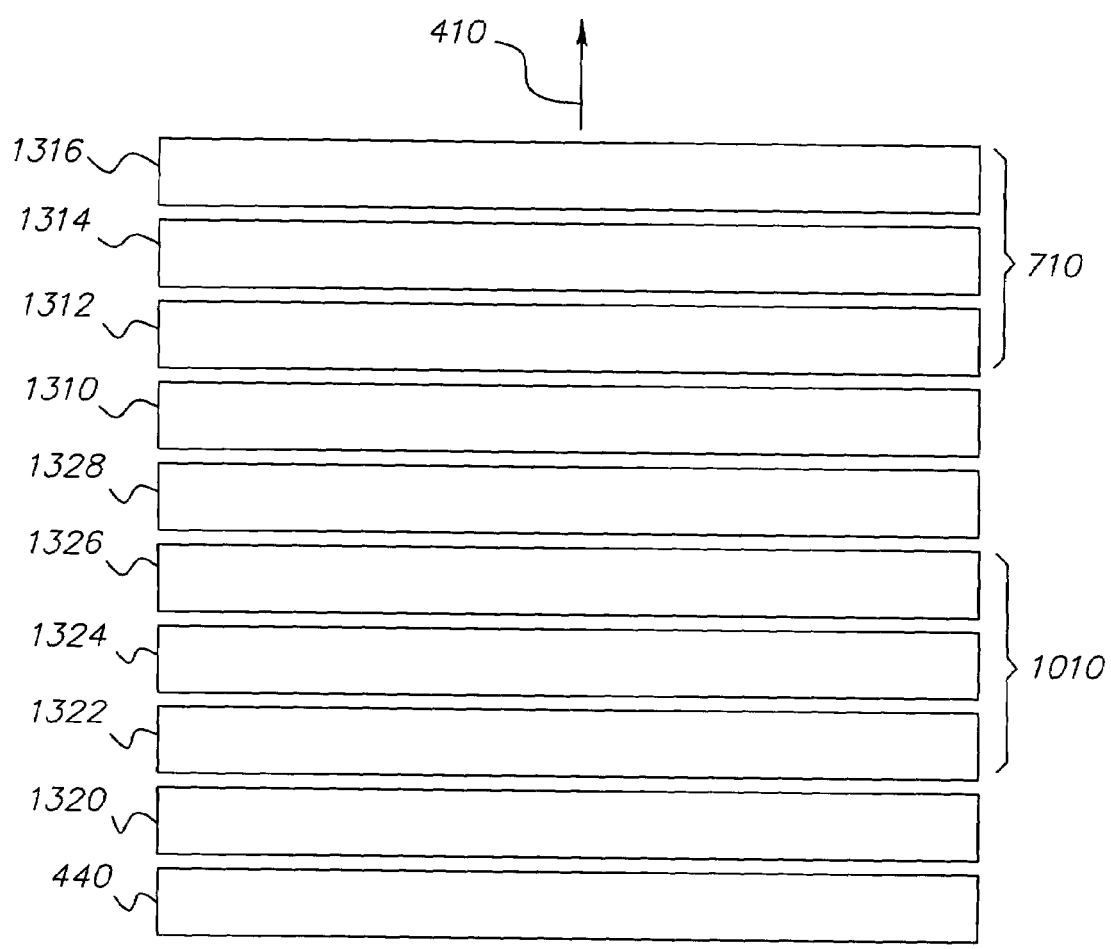
FIG. 13 is a diagram of the construction of an embodiment of the organic VCSEL made in accordance with the present invention.

FIG. 13 shows a schematic cross section of an OLED 1010 pumped organic VCSEL 710. The schematic cross section of an electrically pumped organic VCSEL 710 useful with the present invention includes an OLED 1010 and an organic VCSEL 710 and an optically transparent planarization layer 1310 located between the OLED 1010 and the Bragg reflector (DBR) mirror-1 1312 and DBR mirror-2 1316 and an active region 1314 that is formed from organic materials which employ a host dopant material as described below. An optically transparent planarization layer 1310 is an optically transparent insulating planarization layer compatible with the OLED 1010, for example silicon oxide; however, it can be any optically flat layer compatible with OLED 1010 and upon which a DBR mirror can be grown. The DBR mirror-1 1312 is deposited on the optically transparent planarization layer 1310. It is preferred that it be grown by conventional sputtering or electron beam (e-beam) deposition since it is important to get accurate dielectric layers of accurate thickness. The bottom DBR mirror-1 1312 is composed of alternating high and low refractive index dielectric layers such that, at the wavelength for the laser light-approximately 600 nm, its reflectivity is greater than 99.9% and it transmits greater than 90% of the OLED 1010 incoherent pumplight 720. DBR mirror-1 1312 is composed of $\lambda/4$-thick alternating high and low refractive index dielectric layers in order to get a high-reflectance at the lasing wavelength $\lambda_1$; additionally alternating high and low refractive index dielectric layers are deposited such that there results a broad transmission maximum for the incoherent light 720 emitted by the OLED 1010. Over DBR mirror-1 1312 is deposited the organic active region 1314, which can be formed by conventional high vacuum ($10^{-7}$ Torr) thermal vapor deposition or by spin casting from the solution. In order to obtain low thresholds, it is preferred that the thickness of the active region 1314 be integer multiples of $\lambda/2$ where $\lambda$ is the lasing wavelength. The lowest thresholds are obtained for the integer multiple being either 1 or 2.

The preferred material for the organic active region 1314 is a small-molecular weight organic host-dopant combination typically deposited by high-vacuum thermal evaporation. These host-dopant combinations are advantageous since they result in very small-unpumped scattering/absorption losses for the gain media. It is preferred that the organic molecules be of small-molecular weight since vacuum-deposited materials can be deposited more uniformly than spin-coated polymeric materials. It is also preferred that the host materials used in the present invention are selected such that they have sufficient absorption of the pump beam 720 and are able to transfer a large percentage of their excitation energy to a dopant material via Förster energy transfer. Those skilled in the art are familiar with the concept of Forster energy transfer, which involves a radiationless transfer of energy between the host and dopant molecules.

An example of a useful host-dopant combination for red-lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein. It is the purpose of the organic active region 1314 to receive transmitted pump beam light 720 and emit laser light 410. A DBR mirror-2 1316 is deposited over the active region 1314. It is also deposited by conventional e-beam deposition, however it is preferred that during the deposition process the temperature of the organic stay below 75C. The top DBR mirror-2 1316 is composed of alternation high and low refractive index dielectric layers, such that at the wavelengths for the laser light 420 its reflectivity is greater than 98% and it reflects greater that 90% of the incoherent light 720. Consequently, besides depositing the $\lambda/4$-thick alternating high and low refractive index dielectric layers (where $\lambda$ is chosen near the desired lasing wavelength), additional alternating high and low refractive index dielectric layers are deposited such that there results a broad reflection maximum for the incoherent light 720. In particular, it is only necessary to reflect that portion of the incoherent light 720 which is absorbed by the active region 1314 host material.

The OLEDs 1010 of the organic VCSELs 710 are one or more electrically driven organic organic light diode devices which produce incoherent light within a predetermined portion of the spectrum. For an example of an OLED device, see commonly assigned U.S. Pat. No. 6,172,459 issued Jan. 9, 2001 to Hung et al, and the references cited therein, the disclosures of which are incorporated by reference.

The OLED 1010 is formed adjacent to, and possibly on or in, a substrate 440 on which is formed an electrode layer-1 1320, for example a hole-injecting anode as shown in FIG. 13. The substrate 440 can be any material suitable for construction of OLED devices as are described in the art, for example glass or quartz, and the electrode layer-1 1320 can be a thin layer of indium oxide (ITO) or think layers of conductive metals formed over the substrate 440. The electrode can be deposited by evaporation, sputtering, and chemical vapor deposition.

Figure 14:
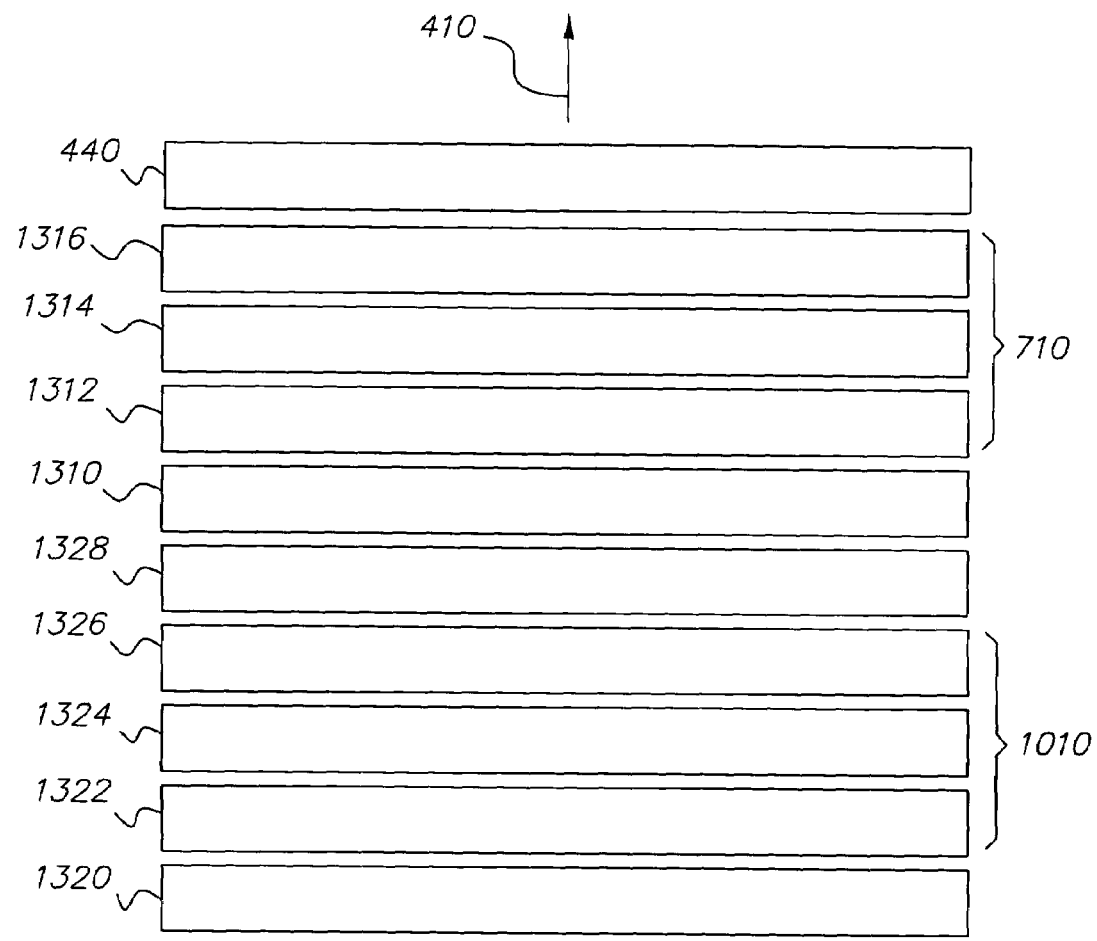
FIG. 14 is a diagram of the construction of another embodiment of the organic VCSEL of FIG. 13 with the substrate in an alternate position.

Alternatively, an electrode can be formed on the optically transparent planarization layer 1310 as shown in FIG. 14. An organic hole transport layer-1 1322 is formed over the electrode layer-1 1320, an organic light emissive layer 1324 is formed over the hole transport layer-1 1322, and an organic electron transport layer-2 1326 is formed over the emissive layer 1324. As an example of these three layers, a useful structure includes a diamine layer such as 4,4'-bis[N-(1-naphthyl)-N-phenylamino]biphenyl (NPB) for the hole transport layer-1 1322, undoped 9,10-Bis(2-naphthalenyl) anthracene (AND) for the emissive layer 1324, and aluminum tris(8-hydroxyquinoline) Alq as the electron transport layer-2 1326. These organic layers are typically prepared by high-vacuum thermal evaporation. Their preferred thickness is 40-250 nm for the NPB, 10-50 nm for the AND, and 10-200 nm for the Alq.

A second electrode layer (electrode layer-2) 1328 (for example a cathode) is formed over the electron transport layer-2 1326 and of a material selected to have a work function less than 4.0 eV. A suitable electrode layer-2 1328 is indium tin oxide or MgAg, where the MgAg volume ratio is 10:1. It can be formed by conventional thermal vapor deposition. An insulating, optically transparent planarization layer 1310 is formed over the cathode and the organic VCSEL 710 formed upon the optically transparent planarization layer 1310.

Additional layers as are known in the art can be included in the OLED 1010 structure. For example hole injection and electron injection layers. As is well understood in the art, a voltage V can be applied across the electrodes to provide the necessary electric field for causing the light layer to produce the pump beam light 720 which is transmitted out of the organic VCSEL 710. The voltage V can be continuous or in the form of pulses.

Under typical bias conditions, negative charge carriers (electrons) will be injected from the electrode layer-2 1328 into the organic electron transport layer-2 1326 and positive charge carriers (holes) will be injected from the electrode layer-1 1320 into the organic hole transport layer-1 1322. Electrons and holes are transported through both corresponding organic transport layers 1326 and 1322 and into the organic light emissive layer 1324. In the organic light emissive layer 1324 the electrons and the holes recombine near the junction between the hole transport layer-1 1322 and the light emissive layer 1324. The resulting recombination results in light emission from the organic light emissive layer 1324. Of the light generated in the layer, approximately 50% is directly emitted in the direction of the substrate 440 while the other 50% is emitted directly toward the electrode layer-2 1328. The electrode layer-2 1328 is transparent and allows the light to pass through the optically transparent planarization layer 1310 to optically pump the vertical cavity laser.

The electrode layer-1 1320 and the underlying substrate can be made reflective so that the portion of the light emitted toward the electrode layer-1 1320 can be reflected out of the device to pass through the transparent insulating planarization layer as well. It is well known in the art that the positions of the anode and cathode and the hole and electron injecting and transport layers can be reversed so that electrode layer-1 1320 is a cathode and electrode layer-2 1328 is an anode. In this case, a reflective cathode can be deposited upon the substrate while the anode is transparent.

After existing the OLED 1010, the incoherent light 720 enters the organic VCSEL 710 through DBR mirror-1 1312. As a result of the bottom DBR mirror-1 1312 design, the majority of that light passes into the active region 1314. By construction, the active layer host absorbs some fraction of the incoherent light 720. Of the fraction of the light, which did not get absorbed, the remaining fraction for incoherent light 720 enters the top DBR mirror-2 1316, where a large fraction of the light is back reflected into the active layer for a second pass. During the second pass, the active layer host absorbs an additional fraction of the incoherent light 720.

Via the Forster energy transfer mechanism, the light energy absorbed by the host is non-radiatively transferred to the dopant molecules. It is preferred that the dopant molecule has a quantum efficiency for emission since that results in the majority of the non-radioactively transferred energy being re-emitted as longer wavelength light. For example, with AND ad the OLDE light emitter material, Alq as the active layer host and 4-(dicyanomethylene)-2-t-butyl-6-(1, 1,7,7-tetramethyljulolidyl-9-enyl)-4H-pyran DCJTB as the active layer dopant, the emitted OLED light is blue: Alq mainly absorbing in the blue while DCJTB emits in the red.

The organic VCSEL 710 is designed to have a high-Q cavity for red light, especially for wavelengths where the top and bottom DBR mirrors have their highest reflectivities. Those skilled in the art are familiar with the concept that lasing occurs at a particular wavelength, which has the highest net gain. At that wavelength, the laser light 410 reflects many times between the top and bottom DBR mirrors prior to being emitted mainly through the top DBR mirror-2 1316 (since the mirror loss of the bottom DBR mirror is much lower by design than of the top DBR mirror).

In this embodiment, the organic VCSEL 710 and the electrically driven OLED 1010 are combined in an integrated device formed on the substrate 440 with the electrically driven OLED 1010 located on the substrate 440 and the organic VCSEL 710 above the OLED 1010 and separated from it by the optically transparent planarization layer 1310. Consequently, the bottom DBR mirror-1 1312 is composed of alternating high and low refractive index dielectric layers such that at wavelengths for the laser light 410, its reflectivity is greater than 99.9% and it transmits greater than 90% of the incoherent light 720. Correspondingly, the top DBR mirror-2 1316 is composed of alternating high and low refractive index dielectric layers such that at the wavelength for the laser light 410, its reflectivity is greater than 98% and it reflects greater than 90% of the incoherent light 720.

Figure 15:
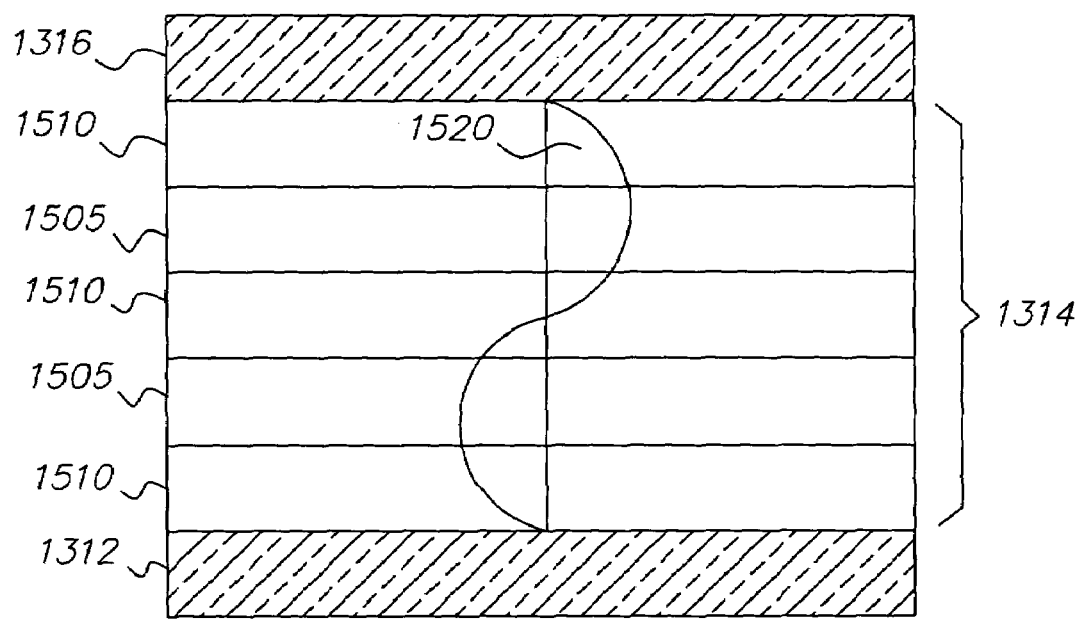
FIG. 15 is a diagram of the construction of an organic VCSEL with an active region design.

The efficiency of the laser is improved further using an active region design as depicted in FIG. 15 for the vertical cavity organic VCSEL 710. The organic active region 1314 includes one or more periodic gain layers 1505 and organic spacer layers 1510 disposed on either side of the periodic gain layers 1505 and arranged so that the periodic gain layers 1505 are aligned with antinodes of the device's standing wave electromagnetic field. This is illustrated in FIG. 15 where the organic VCSEL's 710 standing electromagnetic field pattern 1520 in the organic active region 1314 is schematically drawn. Since stimulated emission is highest at the antinodes and negligible at nodes of the electromagnetic field, it is inherently advantageous to form the active region 1314 as shown in FIG. 15. The organic spacer layers 1510 do not undergo stimulated or spontaneous emission and largely do not absorb either the laser emission 410 or the pump-beam 720 wavelengths. An example of an organic spacer layer 1510 is the organic material 1,1-Bis-(4-bis(4-methyl-phenyl)-amino-phenyl)-cyclohexane (TAPC).

TAPC works well as the spacer material since it largely does not absorb either the laser emission 410 or the pump-beam 720 energy and, in addition, its refractive index is slightly lower than that of most organic host materials. This refractive index difference is useful since it helps in maximizing the overlap between the electromagnetic field antinodes and the periodic gain layers 1505. As will be discussed below with reference to the present invention, employing periodic gain layers 1505 instead of a bulk gain region results in higher power conversion efficiencies and a significant reduction of the unwanted spontaneous emission. The placement of the periodic gain layers 1505 is determined by using the standard matrix method of optics (Corzine et al. IEEE J. Quant. Electr. 25, 1513 [1989]). To get good results, the thicknesses of the periodic gain layers 1505 need to be at or below 50 nm in order to avoid unwanted spontaneous emission.

Figure 16:
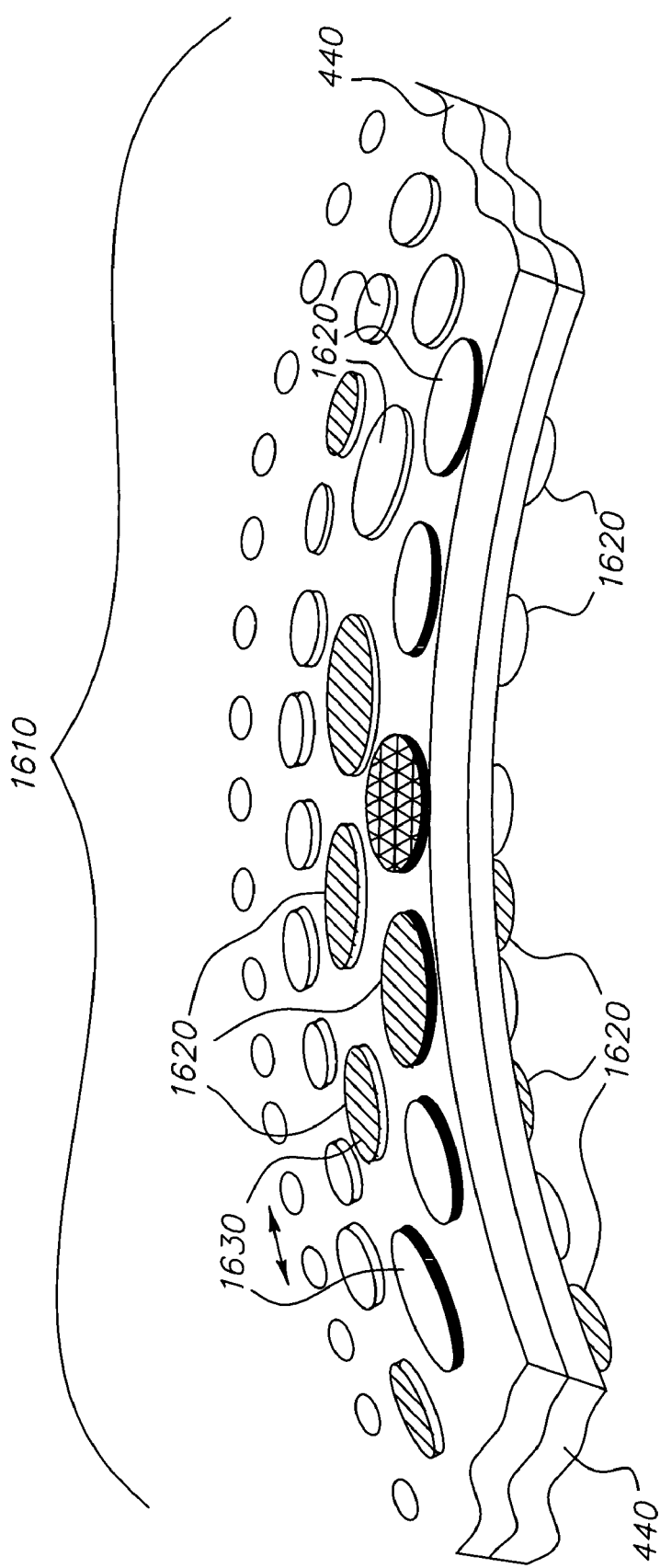
FIG. 16 is a detailed diagram of a VCSEL array.

A laser light pixel 520 can be increased in area while maintaining a degree of spatial coherence by utilizing a phase locked organic layer array 1610 as depicted in FIG. 16. To form a two dimensional phase locked organic laser array 1610, laser elements 1620 separated by inter-element spacing 1630 need to be defined on the surface of the organic VCSEL 710. To obtain phase locking, intensity and phase information must be exchanged amongst the laser elements 1620. This is best obtained by weakly confining the laser emissions to the lasing regions by either small amounts of built-in index or gain guiding, e.g. by modulating the reflectance of one of the mirrors.

FIG. 16 shows the reflectance modulation is affected by patterning and forming an etched region in the bottom of the dielectric stack using standard photolithographic and etching techniques, thus forming a two dimensional array of laser elements 1620 in the form of cylindrical pillars on the surface of the bottom dielectric stack. The remainder of the organic VCSEL 710 structure is deposited upon the patterned bottom dielectric stack as described above. In this embodiment the shape of the laser elements 1620 is circular, however other shapes (such as rectangular) are possible. The inter-element spacing 1630 is in the range of 0.25 to 5 micrometers.

Phase locked array operations will also occur for larger inner-region spacings, however larger spacings lead to inefficient usage of the optical pumping energy. The etch depth is preferred to be from 200 to 1000 nm deep. By etching just beyond an odd number of layers into the bottom dielectric stack, it is possible to affect a significant shift in the longitudinal mode wavelength in the etched region away from the peak of the gain media, thus preventing lasting action and significantly reducing spontaneous emission in the inter-element spacing 1630 area between laser elements 1620. The end result is the formation of the etched region is that the laser emission is weakly confined to the laser elements 1620 so no lasing originates for the area between the regions and coherent phase locked laser light is emitted by the locked organic laser array 1610.

By using a plurality of coherent phase locked laser emitters, a larger addressable area can be formed that emits light of a single wavelength. Different addressable areas can be formed to emit light of different colors to provide a full color image display. It is also possible to construct a single, individually addressable area that emits light of multiple colors, for example—white. By modifying the inter-element spacing 1630 so the elements are arranged in groups to make locked organic laser arrays 1610 wherein the inter-element spacing 1630 between the elements within a group are the same, and the spacing between the groups is sufficiently large as to prevent lasing action the groups, the resulting groups emit light of different colors.

Different OLED 1010 materials can be used in association with each group as desired to assist the emission of differently colored light from each group within a single, individually addressed light laser pixel. The individually addressed light laser pixel can thus emit light that is a combination of the frequencies. For example, an individually addressed light laser pixel can be made to emit a white light. The white point of the addressable laser light pixel 520 can be controlled by adjusting the ratio of the number of groups differently colored light within the element, for example having one laser array within an addressable light laser pixel larger than another laser array.

Figure 17:
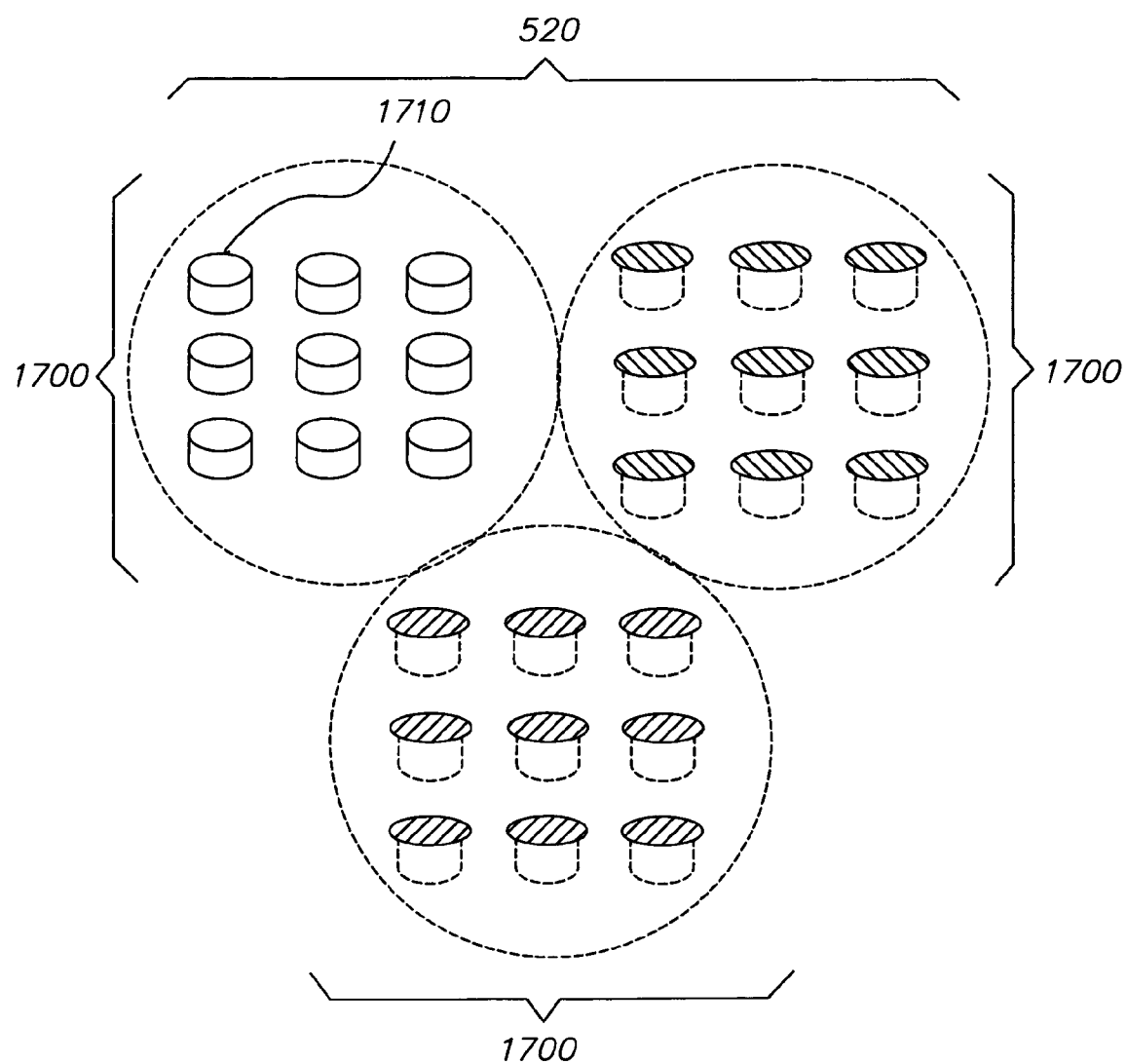
FIG. 17 is a diagram of a color VCSEL array.

FIG. 17 shows an individually addressable laser light pixel 520 includes three groups of color capable arrays 1700 of light elements 1710 for light of different colors. Each group of color capable arrays 1700 includes one or more lasing elements 1710 wherein all of the lasing elements 1710 within a group of color capable arrays 1700 emit light of the same color. As noted above, the groups of color capable arrays 1700 may have different numbers of elements to provide a specific intensity of light emission from each group. The overall wavelength emitted from the laser light pixel 520 can be adjusted by adjusting the intensity of light emission from each group as in the case where adjusting the white point of a white laser light pixel 520. Alternatively, a white light pixel 520 may include a mixed group of differently colored laser elements 1710 that are not mode locked, but that are arranged in a manner that promotes the mixing of the colors from the laser elements 1710. Alternatively, as shown in FIG. 12, it may be preferable to change the color of the output of a single VCSEL 710.

The essence of the scanless display is the fact that an array of lasers (or other suitable photonic emitters) can be simultaneously (for the purposes of this invention) caused to emit light. By associating memory locations with each laser and a time with each memory location, a command to withhold firing can be placed in memory such that when the mass firing command is executed, selected lasers will not emit. These elements meet the requirements for a scanless display, namely that all lasers are simultaneously addressed yet each laser's state is individually determined, not in a sequential (scanning) manner but in whatever manner is most efficient where efficiency is determined by the designer in light of the use of the display.

Standard capture and display systems utilize scanning, a means familiar to those versed in the design of such systems. Scanning uses one or more interrogating beams that have their reflection(s) modulated by interaction with a target (such as an image expressed as electrical charges), that interaction sensed, encoded, stored or transmitted and then decoded to modulate an exciting beam to activate image pixels in a similar spatial-temporal sequence and pattern as was used during capture.

In this example, the ability to create an array of image light pixel 520 generating organic VCSELs 710 to illustrate an alternative method of generating an image will be used.

Examples of scanless methods of driving the displays were given previously. In one example, it was outlined how organic VCSELs 710 can in some cases use ambient light to pump the organic VCSEL 710 to emit. Given ambient light stimulation, a scanless system is readily created by attaching a fiberoptic bundle (or functionally equivalent means of guiding light rays) to the electrode layer of the organic VCSEL 710, allowing the ambient light transmitted from one location to stimulate lasers to emit at the opposite end.

By having a light pump associated with a laser and a unique receiver/transmitter pair, another version of a scanless display is created. In this case the light would be transmitted via wired or wireless transmission as data that would trigger a response of a light pump at the receiver end, in turn causing the light source associated with the organic VCSEL 710 to pump and produce output.

The preceding examples benefit from the simplicity of being instantaneous and therefore not requiring synchronization. Next it will be discussed how the system can be used to create a scanless display where the image content is not provided instantaneously but comes from some form of storage or from a capture system that is not scanless; thus requiring some form of storage, timing and synchronization.

In the case of a scanless system, the state (excited or not excited) of all the image pixels of the display for a time, Tn needs to be captured) because all image pixels elements may be simultaneously activated (although less than all image pixels may actually be selected for activation). This sounds daunting until it is considered that broadcasting typically simultaneously updates many devices. Any mechanism (such as an electromagnetic field) that can carry a signal (that is, can be varied or modulated in an intentional way) can be used to cause a synchronized change of state to emitters tuned to respond to the signal. In this case, rather than thinking of many different broadcast channels carrying many different programs as the illustration used for a real-time embodiment, the system can be thought of as a broadcast that goes out and instructs many video players attached to many televisions to simultaneously start or stop playing the many different programs that had been previously loaded on each video player. The effect is the same as that produced by the real-time broadcast, but the content is not real-time.

In the case of this invention, the "video players" are memory locations associated with photonic emitters (the organic VCSELs 710) rather than the televisions of the simile. An electrical field will be used to near-simultaneously address all the emitter/memory locations in concert (rather than the "broadcast" of the example). For this embodiment an electrical field is used but that does not exclude other field effects (such as a magnetic fields) from potentially being used. In this embodiment, timing and synchronization will be addressed by circuitry cycling through an emitter's associated memory locations ("the tape") in response to the timing pulse in the repeated and identical modulations of the electrical field. This does not exclude the use of other timing and synchronization systems as described elsewhere in the patent.

Three methods of modulation in keeping with the system's goal of being able to individually address each laser in an array and to do so in a massively parallel manner to create a scanless display are: modulating the beam prior to beam creation by modulating or interfering with the pump light source, modulating the beam as it is being created where the laser cavity is altered to inhibit lasing, and modulating the beam after it has been created.

The mechanism subsequently outlined may be adapted for any of the three general means of modulation, this example will for the sake of simplicity use the case where the device takes advantage of the low level of incoherent pump light characteristics of organic lasers and the "individually addressable" array design to modulate the display laser by controlling the pump source, thus also allowing the organic lasers to be pumped from multiple sources. This provides the advantage that the image sources (from storage or from the surrounding environment) can alternate, or be combined in continuous range of combinations.

We further define this embodiment as one that takes the transmitter/receiver/exciter and associates storage with the transmitter and receiver. The storage is composed of memory locations capable of storing at least one data bit rendering it capable of storing the change of state information that will be used to determine whether the exciter will go off or on during the broadcast to emit.

Next, a broadcast timing circuit (or means of leveraging existing timing broadcasts such as those based on the atomic clock) is added to constantly cause all the organic VCSELs 710 to simultaneously query their dedicated memory locations. At this juncture, a rudimentary but functionally complete near instantaneous, scanless display system has been described.

As described, all exciters for all organic VCSELs 710 need to be addressed with their change of state information simultaneously, which requires a means of making sure that for a given moment in time T, all data is loaded into all the storage locations (that data being the change of state for a particular organic VCSEL 710 for a particular time T) and that such data will be applied to the exciters of all the organic VCSELs 710 when the proper time is identified.

FIG. 18 shows a functional block diagram of the process 1810 used to modulate the image pixels to create a scanless display that is displaying stored or generated data (rather than in response to changes in the lighting environment of the display device.)

The process 1810 uses at least one buffer holding the firing state of the laser (off or on) and at least 3 memory locations (for simplicity of explanation) labeled (x), (x+1) and (x+2) associated with each laser where x is a spatial coordinate of an organic VCSEL 710.

The process 1810 defines each memory location as being in one of three states; Tn−1 1820 (the moment before Tn) where the memory is available to be loaded with a value that will then be queried at time Tn, Tn 1830 where memory is being read to determine the firing state of the organic VCSEL 710, and Tn+1 1840 (the moment after Tn) where the memory location is set to 0. The process then repeats itself as often as necessary.

Figure 18A:
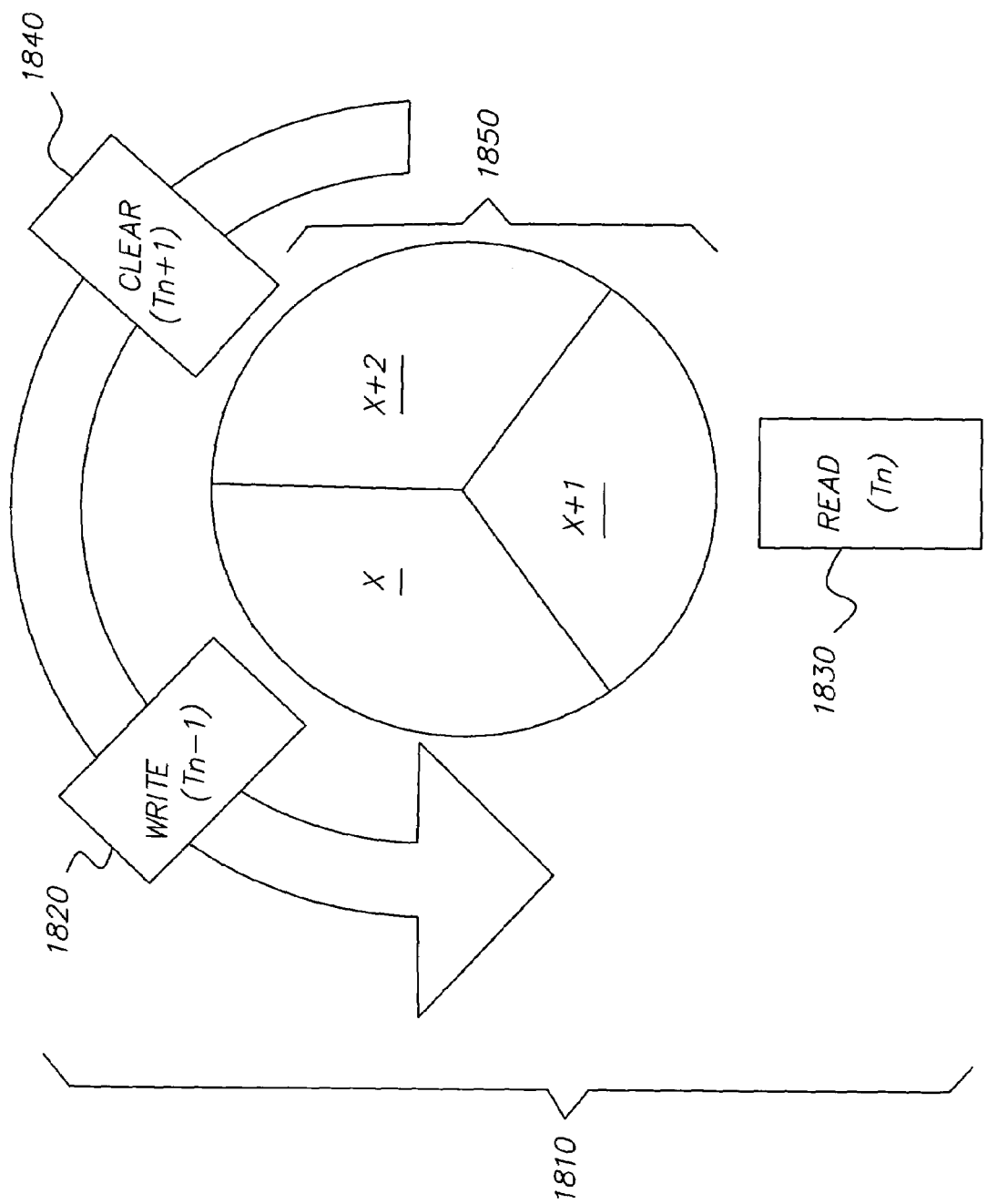
FIGS. 18 a, b, c shows a sequence of actions to update memory locations to create a simultaneously but individually addressed image pixel display, abd.

FIG. 18a shows the process 1810 beginning at the time Tn−1 1820 when the system is turned on and change of state information for all lasers arrives is loaded into each lasers memory (x).

This patent's model uses a simple scheme, well known to those versed in the art of compression encoding, of only sending data when an image pixel needs to change state. The reception of a data packet of a valid laser location and a time are sufficient to indicate that the state of the laser at that time (either on or off) must change as per a Boolean logical exclusive "OR" (XOR) operation. That is, if the laser is on, it goes off. If it is off, it goes on. If nothing is received, the state doesn't change.

To maintain the simplicity of the explanation, an example where all memory locations are enabled simultaneously will be used. In actuality, benefits are likely to result from treating the display as an aggregate of image light pixel 520/organic VCSELs 710 arrays that are treated as separate scanless displays in the manner typical of compression encoding technology. Further benefits are likely to accrue to from dynamically defining the extent of these arrays in response to viewer interest and content. For example, knowledge of where viewer attention is focused would permit defining a subarray of the display as not requiring any update. Within the area of viewer attention, parts of the image may require frequent update while other parts may require so little that that updates are ignored.

Figure 18B:
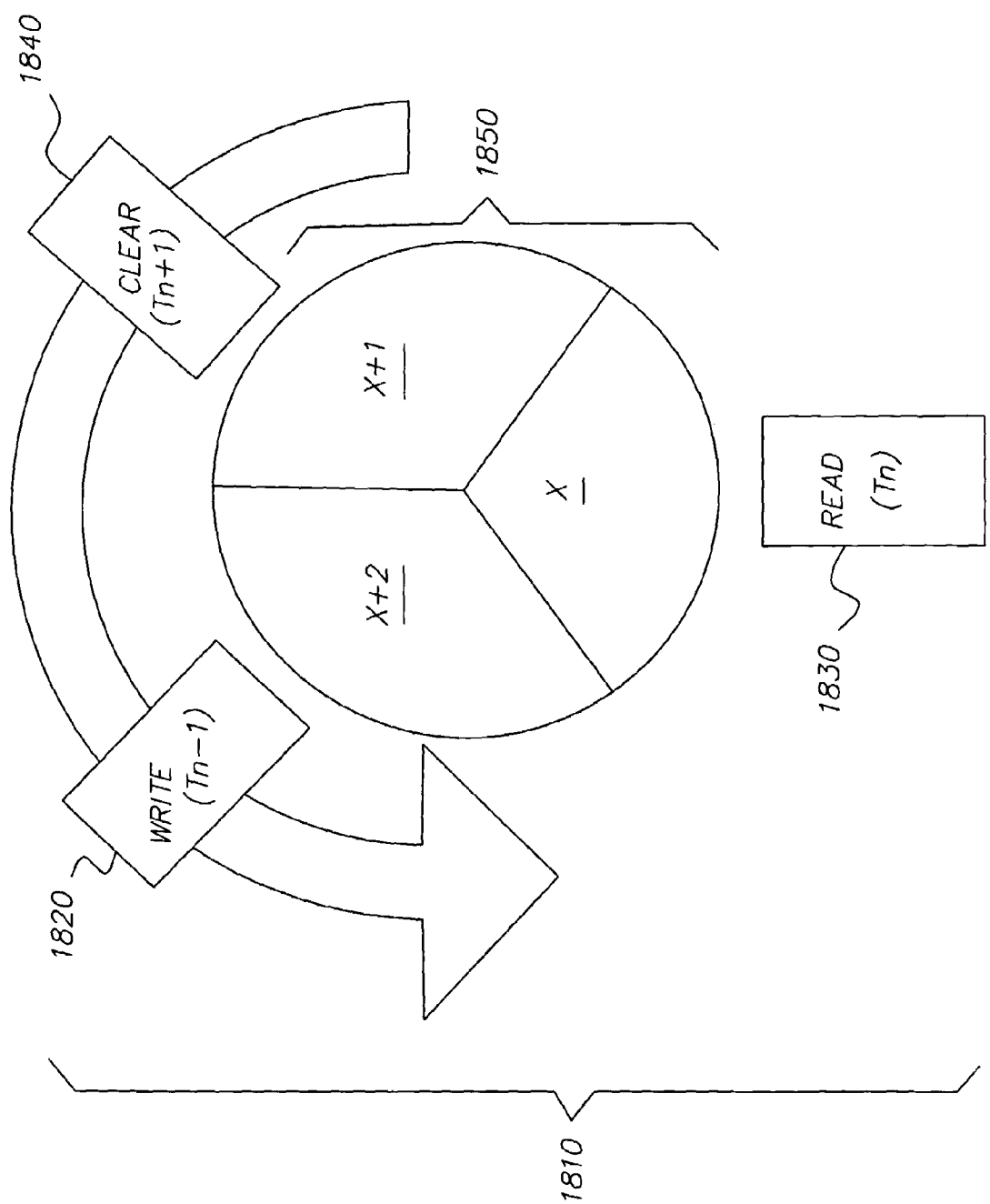

In FIG. 18b, at time Tn 1830 the memory location (x) is selected and read which causes the organic VCSEL 710 to emit or cease firing based upon its state and the state of the firing buffer for the laser. At the same time, memory location (x+1) is emptied in preparation for possible arrival of change of state information. Also at the same time, memory location (x+2) is available to be loaded with a change of state for the organic VCSEL 710.

An alternative scheme has all state information sent (both start and stop firing), leading to greater communication traffic, but reducing the number of buffered states and memory locations.

Figure 18C:
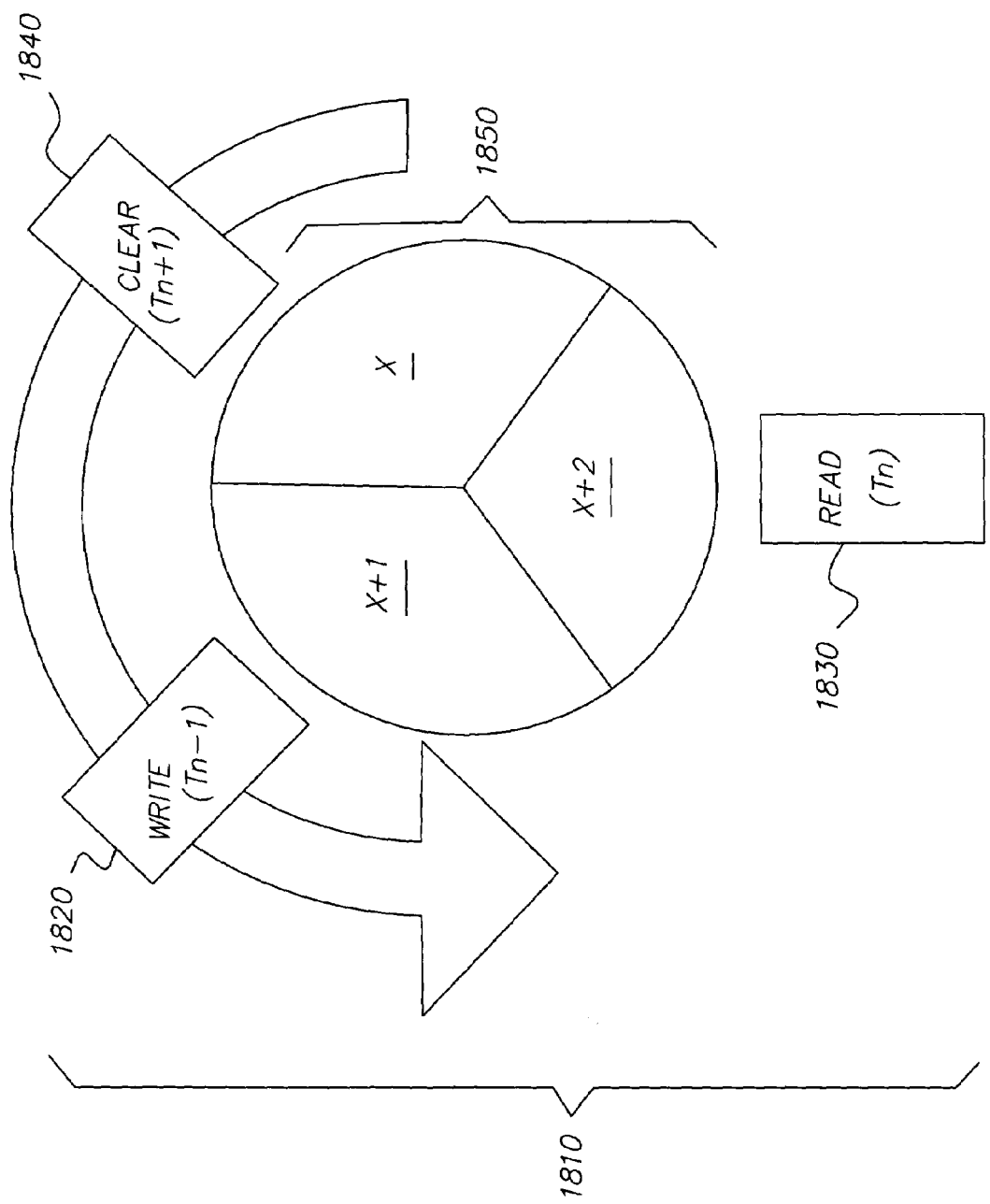

In FIG. 18c for time Tn+1 1840, the memory location (x) is emptied in preparation for the possible arrival of change of state information while (x+1) is available for loading with change of state data and (x+2) is being accessed to determine if the laser should emit or cease firing. Such a scheme means that the greater the number of memory locations, the shorter the possible firing duration up to the physical limits of the device to change state.

The invention perpetually cycles through the memory locations 1850 as shown in FIGS. 18a, 18b and 18c until the unit is turned off. The rate at which the unit cycles through the memory locations 1850 can be variable (as opposed to a scanning system) such that small changes allow higher refresh rates while many changes to image pixels could be compensated for by slower rates of change. In addition, the viewer may choose to manually increase or decrease the refresh rate. In addition, as stated earlier, different regions of the displays may be treated as separate displays with differing refresh rates.

Figure 19A:
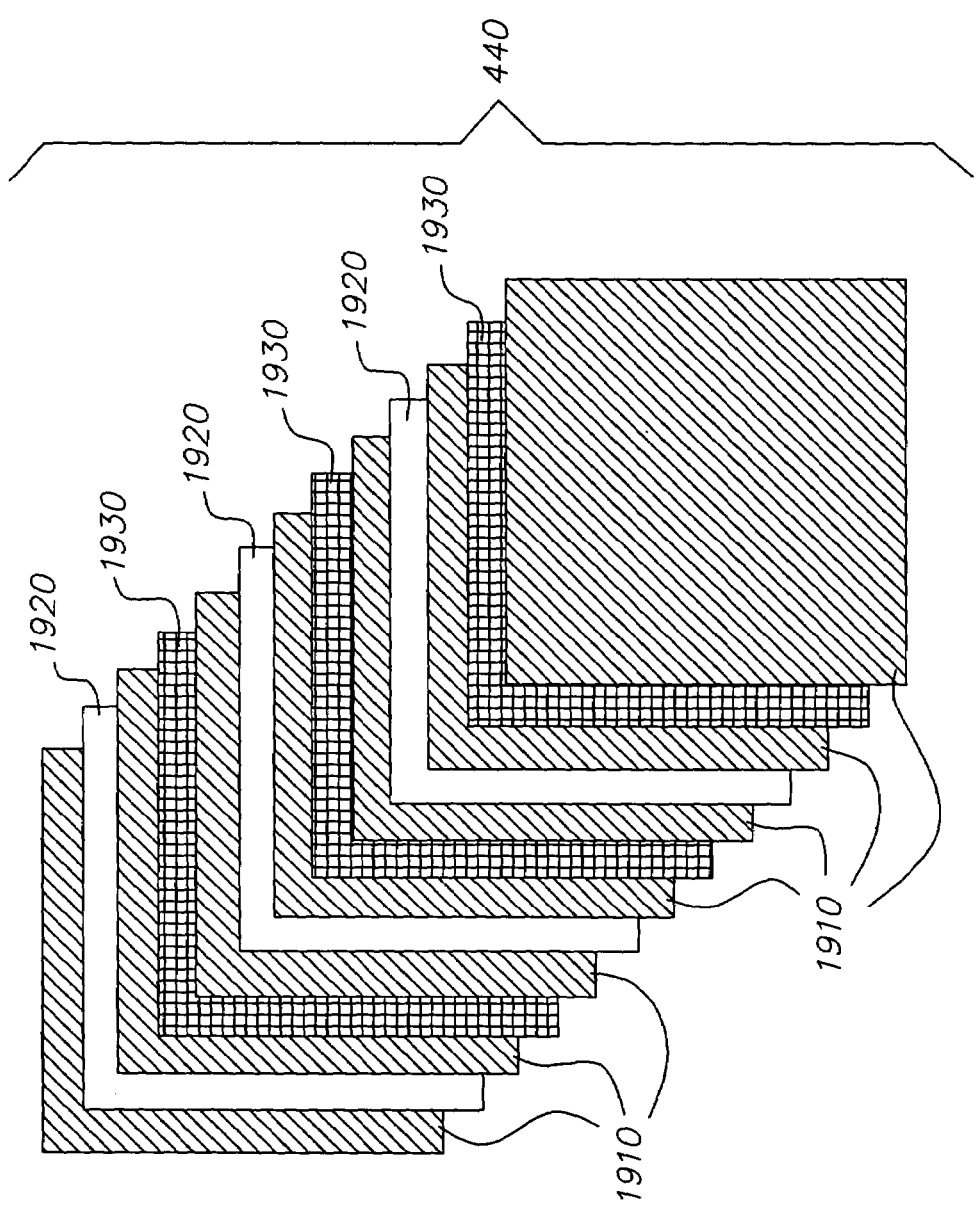
FIGS. 19 a, b shows a mechanism to update memory locations to create a simultaneously but individually addressed display.

FIG. 19a shows a possible mechanism for implementing the modulation scheme diagrammed in FIGS. 18a, 18b, 18c.

By individually enabling all of the organic VCSELs 710 in parallel rather than sequentially, not only is the goal of creating a scanless system achieved, but an additional goal of having all image pixels refreshed simultaneously thus each image displayed is self consistent (rather than a hybrid of the previous image and the current image.) A simpler embodiment where the image pixels are updated purely as needed without regard for simultaneity may be preferable in some circumstances.

Several means of enabling all the organic VCSELs 710 in parallel are available. A magnetic field can be created and collapsed to create a current. likewise other fields (such as electrostatic fields) may be used.

In FIG. 19a is shown the substrate 440 made up of insulating layers 1910 separating power conductive layers 1920 and information conductive layers 1930 useful for supplying a bias. The term "layer" is meant to convey in a simple way the functional organization of the device and is not meant to be taken literally since the power is likely to be supplied by traces or wires and the insulations is likely to be a coating about said tracings or wires.

It should be noted that the organic VCSEL 710 (that has its pump light source connected to the conductive layers) gets power from a power source through a switch, allowing all the lasers to be supplied with power simultaneously and in parallel by one of the power conductive layers 1920. Such a circuit may be implemented in a variety of ways (using power transistors and their functional equivalent and a source of bias coming from any combination of timing and event driven sources) familiar to those versed in the art of electrical circuit design. Such a circuit and power could be use convention in sources of power (using battery or grid as a power source) but may also include wireless means of connection and sources of renewable and constantly available energy such as harnessing muscular movement (eye blinking,) motion/impact via piezoelectric, motion via polymers that create a current when flexed, and photons in the environment (for example solar power). Not excluded are power sources such as thermodynamic, chemoluminescent, chemical, nuclear and quantum.

The biasing information conductive layers 1930, may be thought of as a conductive grid designed to access the memory location 1850 collocated with an organic VCSEL 710, such a memory buffer connected in a manner where the memory is insulated from the power conductive layers 1920 by additional insulating layers 1910 but connected to the power conductive layers 1920 using device controller circuitry 1020 that allows the memory set by the charge through the data conductive layer 1930 to be used to bias the equivalent of a power transistor switch supplying voltage to a pumplight source such as an OLED 1010 for the organic VCSEL 710.

Figure 19B:
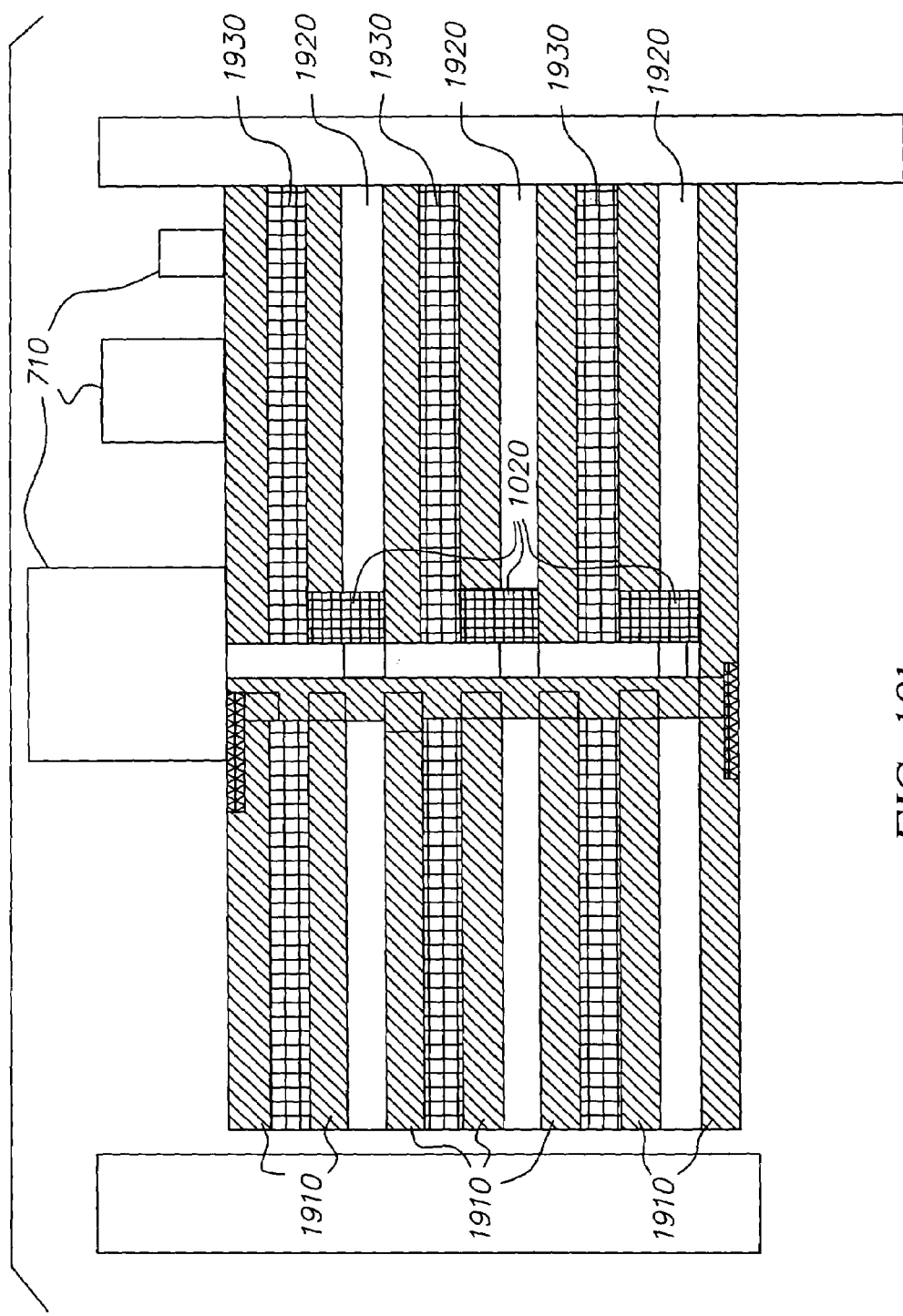

FIG. 19b shows that in between the power conductive layers 1920 and the base of the organic VCSEL 710 is the controller circuit 1020 acting as a functional equivalent of a power transistor switch. A bias voltage available through the data conductive layers 1930 applied to the circuit 1020 and enables it to pass the current to the organic VCSEL 710. This bias voltage is supplied by the memory locations 1850 which are collocated with each organic VCSEL 710. Which memory location 1850 is used to provide the bias is dependent upon which conductive layer is currently charged, each memory array is selected by choice of a power layer. Each memory location is accessible in the manner familiar to those versed in the art of memory chip design, of having an array where unique intersection coordinate provide an address that is assigned to each memory location.

In light of what is occurring to a memory grid (the one that is associated with one power layer,) during the current cycle, it is seen to be beneficial that during the next cycle (when power is applied to the organic VCSEL 710 by the layer associated with the memory grid that has now been loaded with the next set of change values) that the buffer state be XORd with the current bias on the organic VCSEL 710 to cause the organic VCSEL 710 to emit or cease firing. To keep old change information from affecting current states, a cycle should then be taken to clear the buffer memory grids associated with a given power layer once it has been used to define the bias that defines the organics VCSEL's 710 new state. The "new" state, therefore, continues until another change state binary flag is delivered. If no voltage is delivered, no change is initiated. Consequently, during power application by at least one layer, all of the memory locations accessed by the grid associated with the other power layer is wiped clean. During the next cycle, change state voltages are loaded into the wiped memory of that grid. The cycle after, those change state voltages are XOR'd with the actual value of the organic VCSEL's 710 state and emits or kills the associated organic VCSEL 710. The same process is occurring a cycle out of phase with the memory locations of the other memory grid.

Note that since there are three steps (clean, write, read/XOR) in this embodiment, so the embodiment prefers a minimum of three organic VCSEL 710 bias memory grids. It should be noted that these are functional descriptions and that actual product could reduce the time taken to clean and write till the combined time of those functions is equal to or less than the read/XOR time.

Three methods of modulation in keeping with the system's goal of being able to individually address each laser in an array and to do so in a massively parallel manner to create a scanless display are: modulating the beam prior to being created by controlling or interfering with the pump light source, modulating the beam as it is being created where the laser cavity is altered to inhibit lasing, and modulating the beam after it has been created, these means being capable of at least making the beam visible or invisible to the eye 330 but including the possibility of altering some aspect of the beam such as its polarization, wavelength or amplitude.

Although the example discussed focuses on modulation the pumplight source, the system is easily extend to include modulation (alone or in concert) of other organic VCSEL 710 components or devices such as those listed in the detailed description for FIGS. 7,9,10, 11 and 12.

An alternate system can be created, and may be preferred in certain applications for its simplicity or manufacturing advantages, where the system converts change state data into a direct on/off bias in memory. Such an alternate system takes a cycle to copy (using a circuit) all memory locations forward. During the next clock cycle, all memory locations that have changed are updated thus latching the unchanged memory locations (the previous state of the image pixels) and maintaining those states till an intervention occurs. In this manner, a constant wave of data moves forward, the system only having to alter those image pixels whose state has changed. The memory content for time Tn can then be used to directly bias the power available to the organic VCSEL 710. Instead of the circuitry in the display handling the change logic, it is assumed a processor associated with the display compares incoming change of state data for each image pixel and then outputs the appropriate on or off biasing information to the correct memory/time location for those image pixels that have changed.

Controlling the provision of current to the strata is a timing signal, that signal being either a relative timing signal as is typically found in such devices as personal computers in the form of output from a clock chip, or an absolute timing signal as is found in television broadcasts and the previously mentioned UTC standard atomic clock broadcast provided the U.S. National Institute of Standards and Technology.

Once a timing framework is established, the display can respond in a variable manner to conditions of the eye 330 (such as the biological blanking interval that occurs during a saccade as the eye 330 moves between fixation points) allowing the refresh of the display to occur in a manner more harmonious with the refresh rate of the viewer's vision. Other conditions that may prompt a variable rate of refresh are content requirements (faster rates of refresh during high motion segments of content and lower rates during periods of low activity), or other external conditions (such as content delivered over wire or wireless means that suffers from transmission problems).

An alternate approach to choosing which grouping of organic VCSELs 710 associated with a particular time are to have current applied to them simultaneously is to have switches made selectively (by location and time) immune to a change in a field surrounding the device such that there would be a change of selection of all memory/bias locations for a given time along the time axis. This is best imagined as each switch for each image pixel responding to a specific broadcast wavelength but all wavelengths broadcast data in a synchronized manner. This has the advantage of requiring the display be composed of only one strata for power delivery with that strata having a constant flow of current to the organic VCSEL 710 embedded in the display device. Such an embodiment would especially appealing in cases where the organic VCSELs 710 are being simultaneously pumped by an external source of light and where the switches are controlling some of shutter or mirror (like those mentioned in conjunction with FIG. 11 MEMs devices) to modulate the input of ambient light to the pump region.

In the preceding examples, a number of ways are suggested in which organic VCSELs 710 may be continuously and independently modulated on an as-needed basis, rather than in a spatially or temporally sequential basis—the limiting factor being the time to alternate between two or more circuits rather than the time it takes to go through a linear sequence state information addresses.

As stated earlier, there is an advantage to refreshing the image as a whole since this allows the population of the memory buffers for each organic VCSEL 710 to take place in the manner most efficient for each image (as opposed to choosing a system of decompression for the entire image stream as is currently done when decoding an image stream encoded for compression.) For example, image (In) may have the organic VCSEL 710 attendant buffers populated on the basis of physical proximity to one another in the display, while image In+1 might have pixels populated on the basis of providing detail to the most important content area in the image and image In+2 might have buffers populated on the of basis the most rapid update at the expense of resolution.

The invention has been described with reference to a preferred embodiment; however, it will be appreciated that a person of ordinary skill in the art can effect variations and modifications without departing from the scope of the invention.

PARTS LIST

110 a scanless retinal display system
120 input subsystem
130 reception subsystem
140 processing subsystem
150 storage subsystem
160 transmission subsystem
170 display subsystem
310 a head mounting structure
320 frame holding the displays on the head
330 the eye(s)
440 the substrate
510 sensor/emitter combinations
520 light pixel
610 lenslet
710 organic VCSEL
730 ambient light
810 stacked array magnifier (SAM)
1010 organic light diode (OLED)
1020 controller circuitry
1110 switchable micromirror
1110 optically transparent planarization layer
1310 DBR mirror-1
1312 Active region
1316 DBR mirror-2
1320 Electrode layer-1
1322 Transport layer-1
1324 Emissive layer
1326 Transport layer-2
1328 Electrode layer-2
1505 periodic gain layer
1510 organic spacer layer
1610 locked organic VCSEL array
1620 laser elements
1630 inter-element spacing
1700 groups of color capable arrays
1710 light elements
1850 memory location
1910 insulating layers
1920 power conductive layers
1930 information conductive layers

What is claimed is:

1. A scanless display system that projects an image directly onto a retina, comprising:
    a) a plurality of organic laser cavity devices, placed in close proximity to a user's eye, for variably changing individual image pixels; wherein projecting the image directly onto the retina occurs by variably addressing individual image pixel locations and variably changing duration of illumination on individual image pixels upon the retina;
    b) a receiver for receiving transmitted electrical signals that include content information;
    c) a decoder for decoding received electrical signals; and
    d) a modulator for driving the scanless display under predetermined parameters.

2. The scanless display system claimed in claim 1, further comprising:
    e) a plurality of optical sensors, facing the user's eye, for capturing eye data, wherein the plurality of optical sensors are excited by the illumination of individual image pixels reflected by the user's eye;
    f) an encoder for encoding the captured eye data as encoded information; and
    g) a transmitter for transmitting the encoded information.

3. The scanless display system claimed in claim 2, wherein the captured eye data is data selected from the group consisting of retinal movement and position data, pupil dilation, and blood flow within the user's eye.

4. The scanless display system claimed in claim 1, wherein the scanless display is monochromatic.

5. The scanless display system claimed in claim 1, wherein the scanless display is color.

6. The scanless display system claimed in claim 1, further comprising:
    e) a processor for manipulating the content information and encoded information according to the scanless display parameters.

7. The scanless display system claimed in claim 6, wherein the processor compares buffer values and produces an output value indicative of biasing.

8. The scanless display system claimed in claim 6, wherein the processor compares buffer values such that position of the retina is calculated.

9. The scanless display system claimed in claim 1, further comprising:
  e) a storage device for storing the content information and encoded information according to the scanless display parameters.

10. The scanless display system claimed in claim 9, wherein the storage device includes a plurality of buffers for storing the encoded information.

11. The scanless display system claimed in claim 10, wherein the plurality of buffers comprise:
  a) a buffer that stores data representing reflected light from the retina as the retina is illuminated;
  b) a buffer that stores data representing an array of the individual image pixels at a given moment in time;
  c) a buffer that stores a panoramic version of the image; and
  d) a buffer that stores environmental data sent to the scanless display.

12. The scanless display system claimed in claim 11, wherein the environmental data is data selected from the group consisting of GPS data, IR data, RF data, and other position tracking data.

13. A scanless display that projects an image directly onto a retina, comprising:
  a) a plurality of organic laser cavity devices for variably changing individual image pixels; wherein projecting the image directly onto the retina occurs by variably addressing individual image pixel locations and variably changing duration of illumination on individual image pixels upon the retina;
  b) means for tracking position of the retina relative to the scanless display;
  c) means for directing the plurality of organic laser cavity devices at the retina;
  d) a receiver for receiving transmitted electrical signals that include content information;
  e) a decoder for decoding received electrical signals; and
  f) a modulator for driving the scanless display under predetermined parameters.
  g) a means for switching between modulating sources.

14. The scanless display claimed in claim 13, wherein the means for tracking position of the retina further includes:
  e) a plurality of optical sensors, facing the user, for capturing head positioning and eye data of the user;
  f) an encoder for encoding the captured eye data as encoded information; and
  g) a transmitter for transmitting the encoded information.

15. The scanless display claimed in claim 10, wherein the plurality of buffers for storing the encoded information includes time dependent information for changing pixel values of the scanless display.

16. A method for directly projecting a scanless image onto a viewer's eye, comprising the steps of:
  a) variably addressing individual image pixel locations; and
  b) variably changing duration of illumination on the individual image pixels upon the viewer's eye with a plurality of organic laser cavity devices for projecting the scanless image.

17. The method claimed in claim 16, wherein the step of variably addressing individual image pixel locations further comprises the steps of:
  a1) identifying a change of state of the individual image pixel locations for a predetermined absolute unit of time.

18. The method claimed in claim 17, wherein the step of (a1) includes:
  simultaneously addressing the individual image pixel locations for the predetermined absolute unit of time as determined by a clock.

19. The method claimed in claim 17, wherein the step of (a1) includes:
  simultaneously addressing the individual image pixel locations for the predetermined absolute unit of time as determined by a processor.

20. The method claimed in claim 16, wherein the step of changing the duration of illumination of individual image pixel locations includes modulating a pumped light source.

21. The method claimed in claim 16, wherein the step of changing the duration of illumination of individual image pixel locations includes shuttering or deflecting a light output of a pumped light source.

22. The method claimed in claim 16, wherein the step of changing the duration of illumination of individual image pixel locations includes modulating an output of an organic laser cavity device.

23. The method claimed in claim 16, further comprising the steps of:
  identifying an eye position of a viewer and altering content of an image output to the viewer's eye based upon the viewer's eye position.

24. The method claimed in claim 16, further comprising the steps of:
  identifying a viewer's biological state and altering content of an image output to the viewer's eye based upon the viewer's biological state.

25. The method claimed in claim 24, further includes the steps of:
  tracking retinal movement and position;
  tracking pupil dilation; and
  tracking blood flow.

26. The method claimed in claim 16, wherein the scanless image includes content information.

27. The method claimed in claim 16, wherein the scanless image includes viewer environment information.

28. The method claimed in claim 16, wherein the scanless image includes a combination of content information and viewer environment information.

29. The scanless display system claimed in claim 1, wherein the plurality of organic laser cavity devices emit coherent light.

30. The scanless display system claimed in claim 1, wherein an angular distribution of light emitted by the plurality of organic laser cavity devices is substantially narrower than a hemispherical angular distribution.

31. The scanless display system claimed in claim 1, wherein the plurality of organic laser cavity devices emit visible light.

32. The scanless display system claimed in claim 1, wherein variably changing individual image pixels includes updating the image pixels without regard to simultaneity.

33. The scanless display system claimed in claim 1, wherein a first portion of the image pixels have a first refresh rate and a second portion of the image pixels have a second refresh rate different from the first refresh rate.

34. The scanless display system claimed in claim 1, wherein the plurality of organic laser cavity devices are configured to be enabled in parallel.

* * * * *